(12) United States Patent
Kawaguchi et al.

(10) Patent No.: US 12,231,103 B2
(45) Date of Patent: Feb. 18, 2025

(54) ELECTRONIC CIRCUIT AND CALCULATOR

(71) Applicant: KABUSHIKI KAISHA TOSHIBA, Tokyo (JP)

(72) Inventors: Tamio Kawaguchi, Kawasaki Kanagawa (JP); Noritsugu Shiokawa, Yokohama Kanagawa (JP); Hayato Goto, Kawasaki Kanagawa (JP); Taro Kanao, Kumagaya Saitama (JP); Yinghao Ho, Kawasaki Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 86 days.

(21) Appl. No.: 18/168,997

(22) Filed: Feb. 14, 2023

(65) Prior Publication Data

US 2024/0022235 A1 Jan. 18, 2024

(30) Foreign Application Priority Data

Jul. 15, 2022 (JP) .................... 2022-114306

(51) Int. Cl.
*H03H 11/04* (2006.01)
*G06N 10/40* (2022.01)

(52) U.S. Cl.
CPC ............. *H03H 11/04* (2013.01); *G06N 10/40* (2022.01)

(58) Field of Classification Search
CPC ........ H03H 11/04; H03H 7/46; H03H 7/0123; H03H 11/0405; H03H 7/0153; H03H 7/0161; G06N 10/40; H01P 1/2013
See application file for complete search history.

(56) References Cited

U.S. PATENT DOCUMENTS

2018/0091244 A1* 3/2018 Abdo ............... H01P 1/213
2020/0320423 A1 10/2020 Kelly

FOREIGN PATENT DOCUMENTS

JP 7005786 B2 1/2022

OTHER PUBLICATIONS

Bardin, et al., "Quantum Computing", IEEE Microwave Magazine, vol. 21, Issue 8, Aug. 2020.
Jeffrey, et al., "Fast Accurate State Measurement with Superconducting Qubits", Physical Review Letters, vol. 112, 190504, May 15, 2014.

* cited by examiner

*Primary Examiner* — Jung Kim
(74) *Attorney, Agent, or Firm* — Holtz, Holtz & Volek PC

(57) ABSTRACT

An electronic circuit includes a band-pass filter, and at least one first circuit. The band-pass filter includes a plurality of filter resonators. Two adjacent filter resonators included in the filter resonators are mutually couplable. The first circuit includes a first qubit and a first readout resonator. The first readout resonator is couplable with the first qubit and one of the filter resonators. A passband of the band-pass filter includes a first passband and a second passband. A magnitude of a first ripple of the first passband is not more than $1/10$ of a magnitude of a second ripple of the second passband.

11 Claims, 19 Drawing Sheets

FIG. 26A
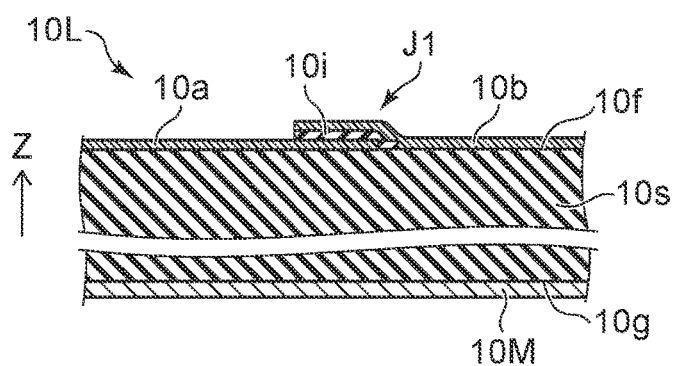
FIG. 26B
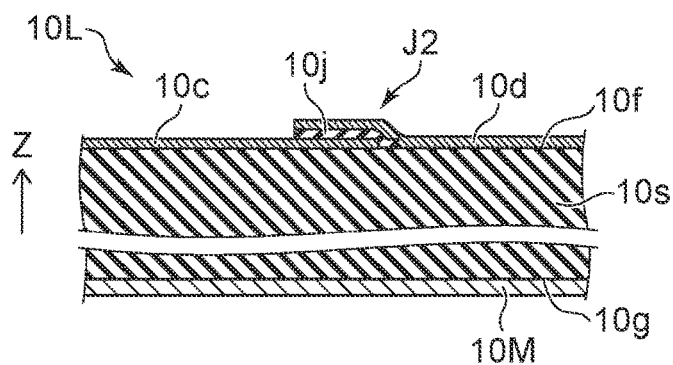
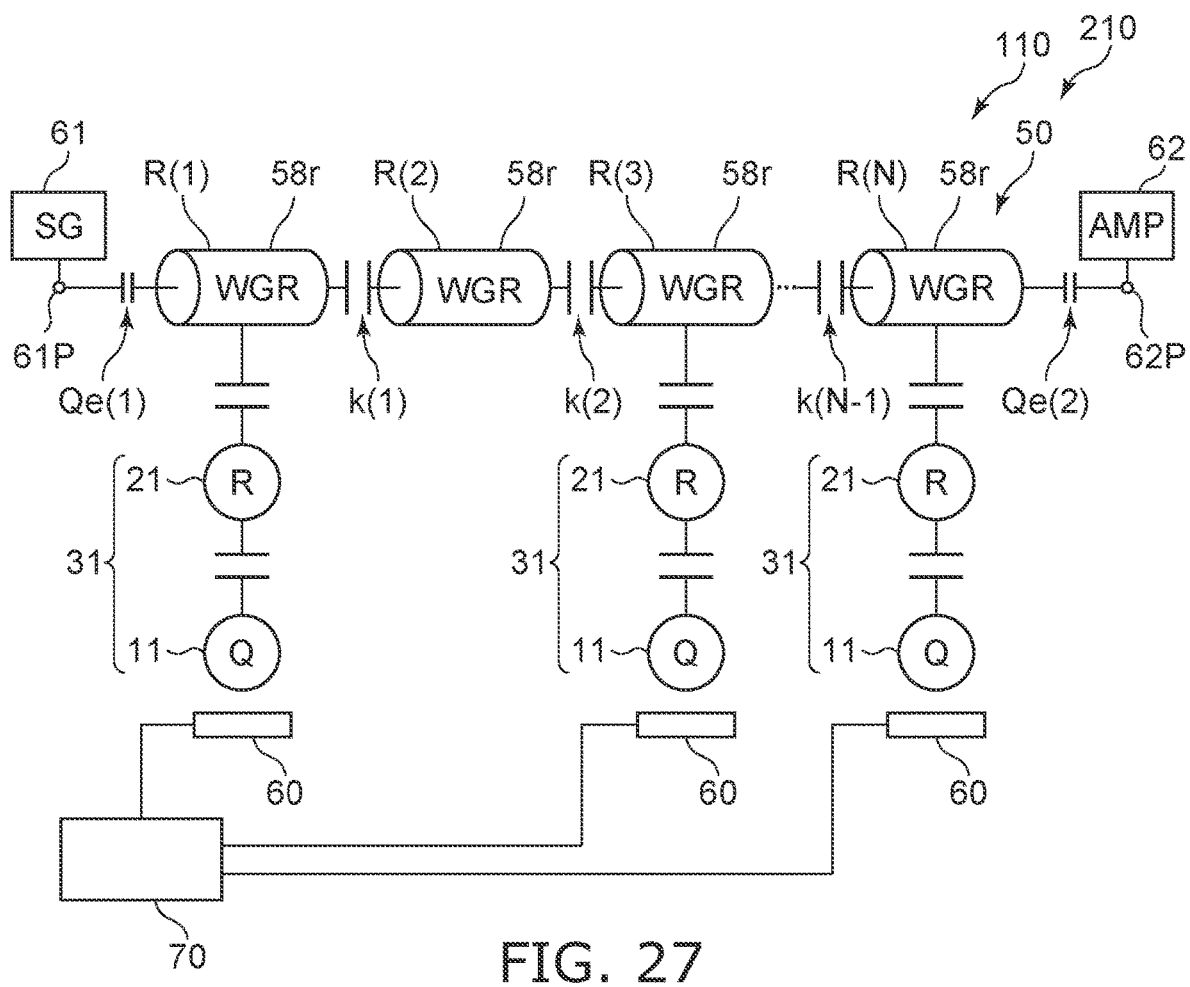
FIG. 27

ELECTRONIC CIRCUIT AND CALCULATOR

CROSS-REFERENCE TO RELATED APPLICATIONS

This application is based upon and claims the benefit of priority from Japanese Patent Application No. 2022-114306, filed on Jul. 15, 2022; the entire contents of which are incorporated herein by reference.

FIELD

Embodiments described herein relate generally to an electronic circuit and a calculator.

BACKGROUND

For example, an electronic circuit that includes a qubit is used in a calculator. It is desirable to improve the characteristics of the electronic circuit.

BRIEF DESCRIPTION OF THE DRAWINGS

FIGS. 26A and 26B are schematic cross-sectional views illustrating portions of the electronic circuit according to the first embodiment;
and
FIG. 27 is a schematic view illustrating the calculator according to a second embodiment.

DETAILED DESCRIPTION

According to one embodiment, an electronic circuit includes a band-pass filter, and at least one first circuit. The band-pass filter includes a plurality of filter resonators. Two adjacent filter resonators included in the filter resonators are mutually couplable. The first circuit includes a first qubit and a first readout resonator. The first readout resonator is couplable with the first qubit and one of the filter resonators. A passband of the band-pass filter includes a first passband and a second passband. A magnitude of a first ripple of the first passband is not more than $\frac{1}{10}$ of a magnitude of a second ripple of the second passband.

First Embodiment

Figure 1:
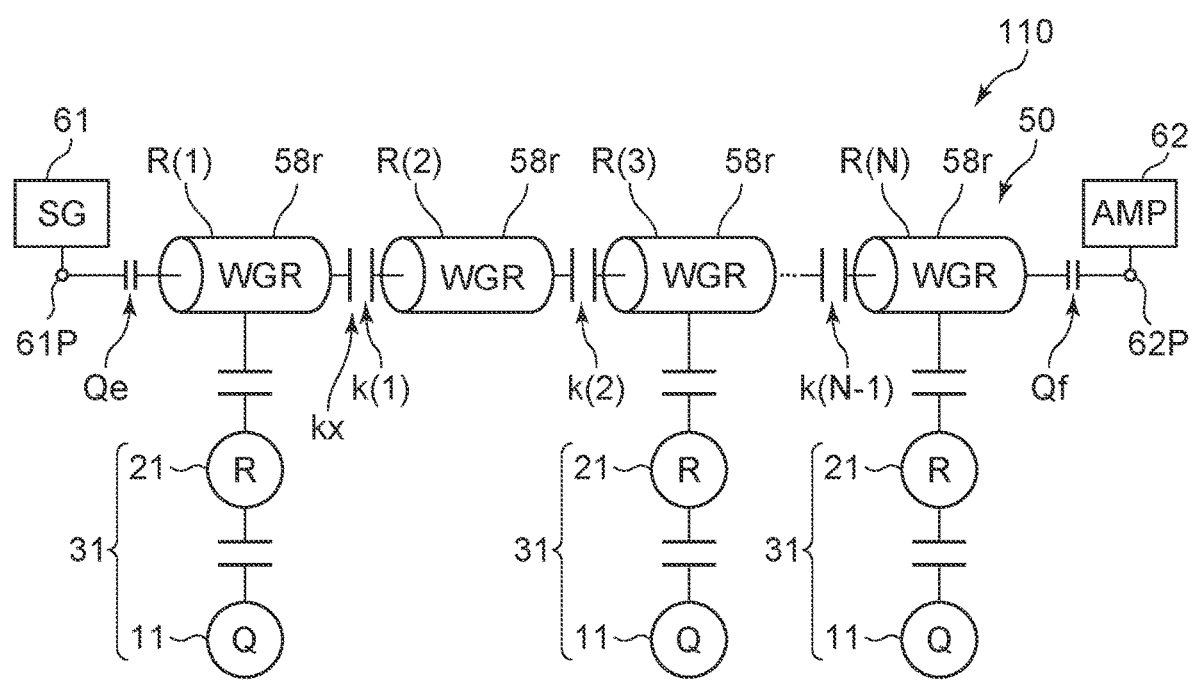
FIG. 1 is a schematic view illustrating an electronic circuit according to a first embodiment.

FIG. 1 is a schematic view illustrating an electronic circuit according to a first embodiment.

As shown in FIG. 1, the electronic circuit 110 according to the embodiment includes a band-pass filter 50 and at least one first circuit 31.

The band-pass filter 50 includes multiple filter resonators 58r. Two adjacent filter resonators 58r included in the multiple filter resonators 58r are mutually couplable. For example, the two adjacent filter resonators 58r included in the multiple filter resonators 58r are electromagnetically coupled.

Electromagnetic coupling includes, for example, at least one of electric field coupling or magnetic field coupling.

Electromagnetic coupling may include, for example, at least one of capacitive coupling or inductive coupling. In one example, for example, the two adjacent filter resonators 58r included in the multiple filter resonators 58r are capacitively couplable. At least two of the multiple filter resonators 58r are connected in series. At least two of the multiple filter resonators 58r are coupled to each other in series.

The multiple filter resonators 58r include, for example, a first filter resonator R(1), a second filter resonator R(2), a third filter resonator R(3), . . . , and an Nth filter resonator R(N). "N" is, for example, an integer not less than 4.

The first circuit 31 includes a first qubit 11 and a first readout resonator 21. The first readout resonator 21 is couplable with the first qubit 11 and one of the multiple filter resonators 58r. The first readout resonator 21 is electromagnetically couplable with the first qubit 11. The first readout resonator 21 is electromagnetically couplable with the one of the multiple filter resonators 58r.

For example, the multiple first circuits 31 may be included. One of the multiple first circuits 31 is couplable with one of the multiple filter resonators 58r. Another one of the multiple first circuits 31 is couplable with another one of the multiple filter resonators 58r. For example, the multiple first circuits 31 may be respectively couplable with the multiple filter resonators 58r.

As shown in FIG. 1, the band-pass filter 50 may further include a first part 61P. The first part 61P is configured to receive input of a signal. The first part 61P is couplable with one of the multiple filter resonators 58r. In the example, the first part 61P is couplable with the first filter resonator R(1).

As shown in FIG. 1, the band-pass filter 50 may further include a second part 62P. The second part 62P is configured to output the signal described above. The second part 62P is couplable with another one of the multiple filter resonators 58r. In the example, the second part 62P is couplable with the Nth filter resonator R(N).

For example, the first part 61P corresponds to an input port. For example, the second part 62P corresponds to an output port. For example, an input signal generator 61 (SG) is included. The first part 61P is configured to receive a signal from the input signal generator 61 and supply the signal to the multiple filter resonators 58r. For example, an output signal amplifier 62 (AMP) is included. The second part 62P is configured to output the output signal of the multiple filter resonators 58r to the output signal amplifier 62.

For example, the state of the first qubit 11 included in the first circuit 31 is read out via the first readout resonator 21 and the multiple filter resonators 58r. In a readout operation, the signal from the input signal generator 61 passes through the band-pass filter 50 and is amplified by the output signal amplifier 62.

In the readout operation, information related to multiple states of the first qubit 11 is obtained. The multiple states of the first qubit 11 include, for example, a first state and a second state. For example, the signal phase difference between the first state and the second state is read out. The state of the first qubit 11 is determined thereby. For example, in the calculator, the first state corresponds to one of "0" or "1". The second state corresponds to the other of "0" or "1".

According to the embodiment, each of the multiple filter resonators 58r may be, for example, a waveguide resonator (WGR). For example, the band-pass filter 50 functions as a Purcell filter. The band-pass filter 50 may be, for example, a Chebyshev filter.

Figure 2A:
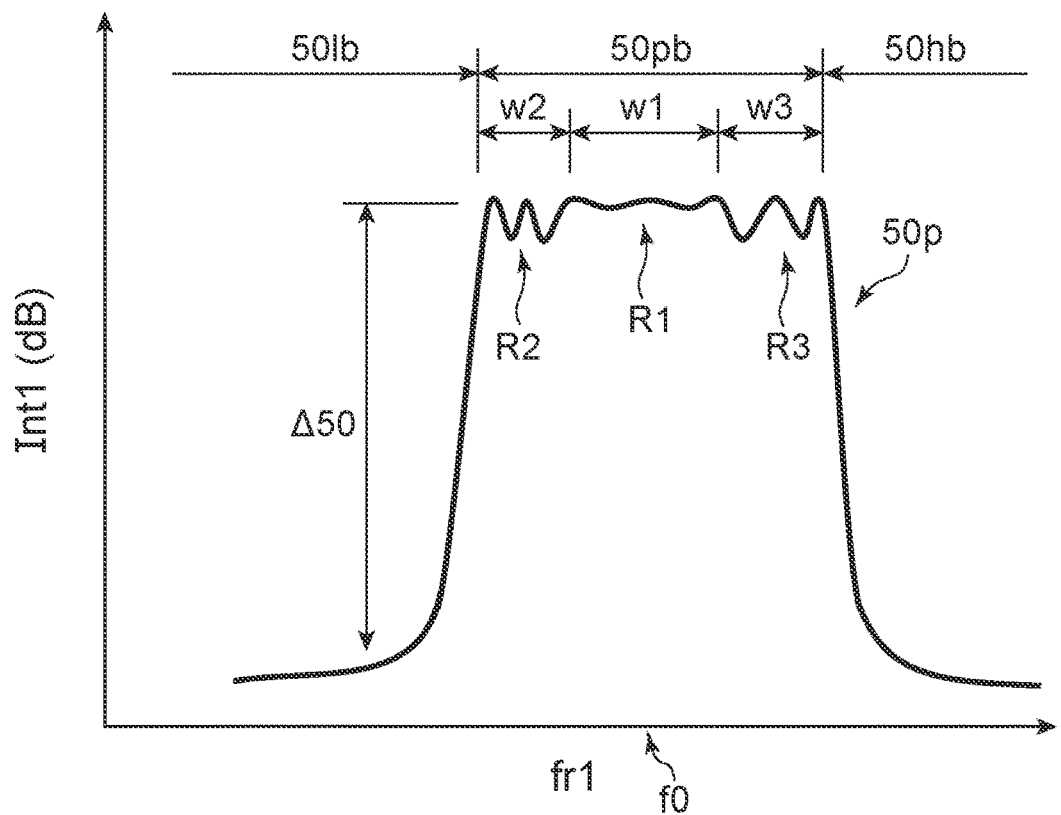
FIGS. 2A and 2B are graphs illustrating characteristics of the electronic circuit according to the first embodiment.
Figure 2B:
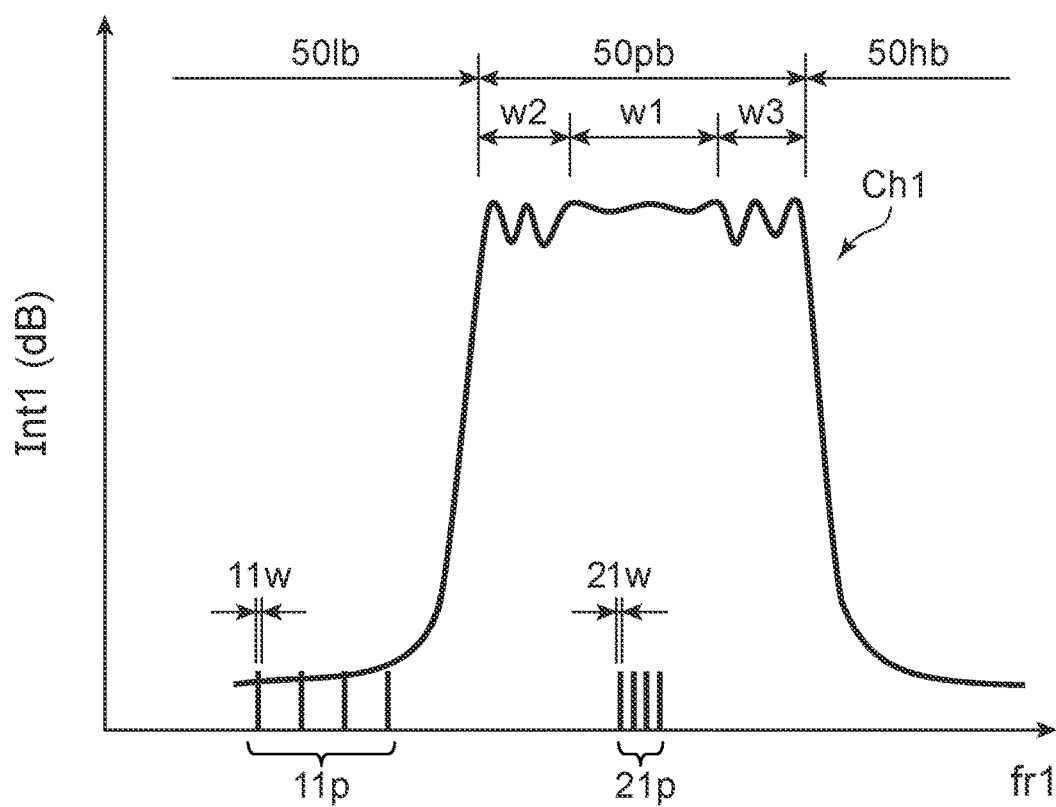

FIGS. 2A and 2B are graphs illustrating characteristics of the electronic circuit according to the first embodiment.

In these figures, the horizontal axis is a frequency fr1 (GHz). In these figures, the vertical axis is a signal intensity Intl (dB).

FIG. 2A illustrates a transmission characteristic 50p of the band-pass filter 50. As shown in FIG. 2A, the band-pass filter 50 includes a passband 50pb and a non-pass band. The non-pass band includes a low-frequency non-pass band 50lb and a high-frequency non-pass band 50hb. The passband 50pb is between the low-frequency non-pass band 50lb and the high-frequency non-pass band 50hb.

The signal intensity Intl (e.g., the transmission amplitude) of the passband 50pb is greater than the signal intensity Intl of the low-frequency non-pass band 50lb. The signal intensity Intl (e.g., the transmission amplitude) of the passband 50pb is greater than the signal intensity Intl of the high-frequency non-pass band 50hb.

For example, the signal intensity Intl of the passband 50pb is not less than 100 times the signal intensity Intl of the low-frequency non-pass band 50lb (e.g., a difference of not less than 20 dB). For example, the signal intensity Intl of the passband 50pb is not less than 100 times the signal intensity Intl of the high-frequency non-pass band 50hb (e.g., a difference of not less than 20 dB with).

As shown in FIG. 2A, the passband 50pb of the band-pass filter 50 includes a first passband w1 and a second passband w2. In the example, the frequency of the first passband w1 is greater than the frequency of the second passband w2. The ripple (a first ripple R1) of the first passband w1 is smaller than the ripple (a second ripple R2) of the second passband w2. The first passband w1 is a passband in which the transmission characteristic is substantially constant. The second passband w2 is a passband in which the transmission characteristic is not constant.

For example, by providing such a first passband w1 and such a second passband w2, high steepness of the characteristic change between the passband 50pb and the non-pass band is obtained. For example, an out-of-band suppression amount Δ50 in the non-pass band can be increased. For example, a faster readout operation is possible. For example, a lower-error readout operation is possible. For example, the number of the multiple first circuits 31 (i.e., the number of the multiple first qubits 11) corresponding to the non-pass band can be increased. For example, the multiple first qubits 11 can be provided at higher density.

In a general filter (a first reference example), a design is applied in which the signal intensity Intl (e.g., the transmission amplitude characteristic) is constant in the entire region of the passband 50pb. Thereby, the signal can pass through the entire region of the passband 50pb with a uniform signal intensity Intl (e.g., transmission amplitude characteristic). In the first reference example, the ripple is small in the entire region of the passband 50pb. In the first reference example, the first passband w1 and the second passband w2 that have mutually-different ripple magnitudes are not provided. In such a first reference example, to make the out-of-band suppression amount Δ50 sufficiently large, it is necessary to use a multi-pole filter including many resonators. The circuit area becomes too large when the first reference example is used in a multi-bit operation. Practical problems occur in the first reference example.

In contrast, according to the embodiment, the first passband w1 and the second passband w2 that have mutually-different ripple magnitudes are provided. It was found that compared to the first reference example, the out-of-band suppression amount Δ50 can be increased thereby. A faster readout operation is possible thereby. For example, the number of the multiple first qubits 11 can be increased. For example, the multiple first qubits 11 can be provided at higher density. According to the embodiment, an electronic circuit can be provided in which the characteristics can be improved.

In the example, the passband 50pb further includes a third passband w3. The first passband w1 is between the second passband w2 and the third passband w3. The magnitude of the first ripple R1 is less than the magnitude of the ripple (a third ripple R3) of the third passband w3.

FIG. 2B illustrates a transmission characteristic Ch1 between the first part 61P and the second part 62P. In the example, the number of the multiple first circuits 31 is 4. FIG. 2B illustrates resonant frequencies 11p of the four first qubits 11 and resonant frequencies 21p of the four first readout resonators 21.

The resonant frequency 21p of the first readout resonator 21 is included in the first passband w1. The resonant frequency 21p of the first readout resonator 21 can pass through band-pass filter 50 with low loss. One of the multiple resonant frequencies 21p has a frequency width (a line width 21w). The width of the product of the line width 21w and the number of the first circuits 31 is included in the first passband w1.

The resonant frequency 11p of the first qubit 11 is included in the non-pass band (e.g., the low-frequency non-pass band 501b) of the band-pass filter 50. The resonant frequency 11p of the first qubit 11 is within the non-pass band of the band-pass filter 50. The resonant frequency 11p of the first qubit 11 substantially does not pass through the band-pass filter 50. One of the multiple first qubits 11 has a frequency width (a line width 11w). The width of the product of the line width 11w and the number of the first circuits 31 is included in the non-pass band (e.g., the low-frequency non-pass band 501b).

According to the embodiment, for example, the frequency change of the first readout resonator 21 corresponding to the state change of the first qubit 11 can be appropriately measured while suppressing the attenuation of the first qubit 11.

Figure 3:
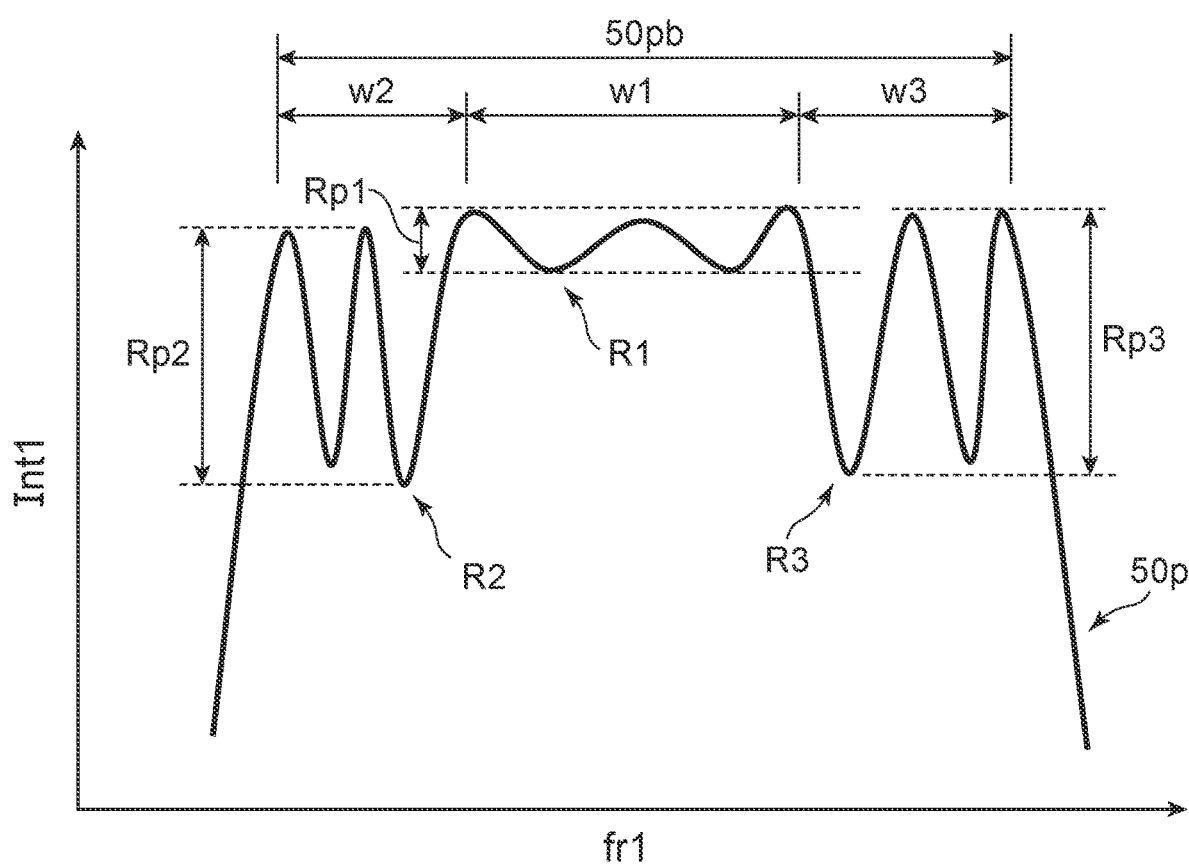
FIG. 3 is a graph illustrating a characteristic of the electronic circuit according to the first embodiment.

FIG. 3 is a graph illustrating a characteristic of the electronic circuit according to the first embodiment.

FIG. 3 illustrates the characteristic of the passband 50pb. The horizontal axis of FIG. 3 is the frequency fr1. The vertical axis of FIG. 3 is the signal intensity Intl.

The difference between the maximum value and minimum value of the signal intensity Intl of the first ripple R1 of the first passband w1 corresponds to a magnitude Rp1 of the first ripple R1. In the second ripple R2 of the second passband w2, the difference between the maximum value and minimum value of the signal intensity Intl corresponds to a magnitude Rp2 of the second ripple R2. In the third ripple R3 of the third passband w3, the difference between the maximum value and minimum value of the signal intensity Intl corresponds to a magnitude Rp3 of the third ripple R3.

According to the embodiment, for example, the magnitude Rp1 of the first ripple R1 is not more than 1/10 of the magnitude Rp2 of the second ripple R2. For example, the magnitude Rp1 of the first ripple R1 is not more than 1/10 of the magnitude Rp3 of the third ripple R3. The magnitude Rp1 of the first ripple R1 may be not more than 1/5 of the magnitude Rp2 of the second ripple R2. For example, the magnitude Rp1 of the first ripple R1 may be not more than 1/5 of the magnitude Rp3 of the third ripple R3.

Figure 4:
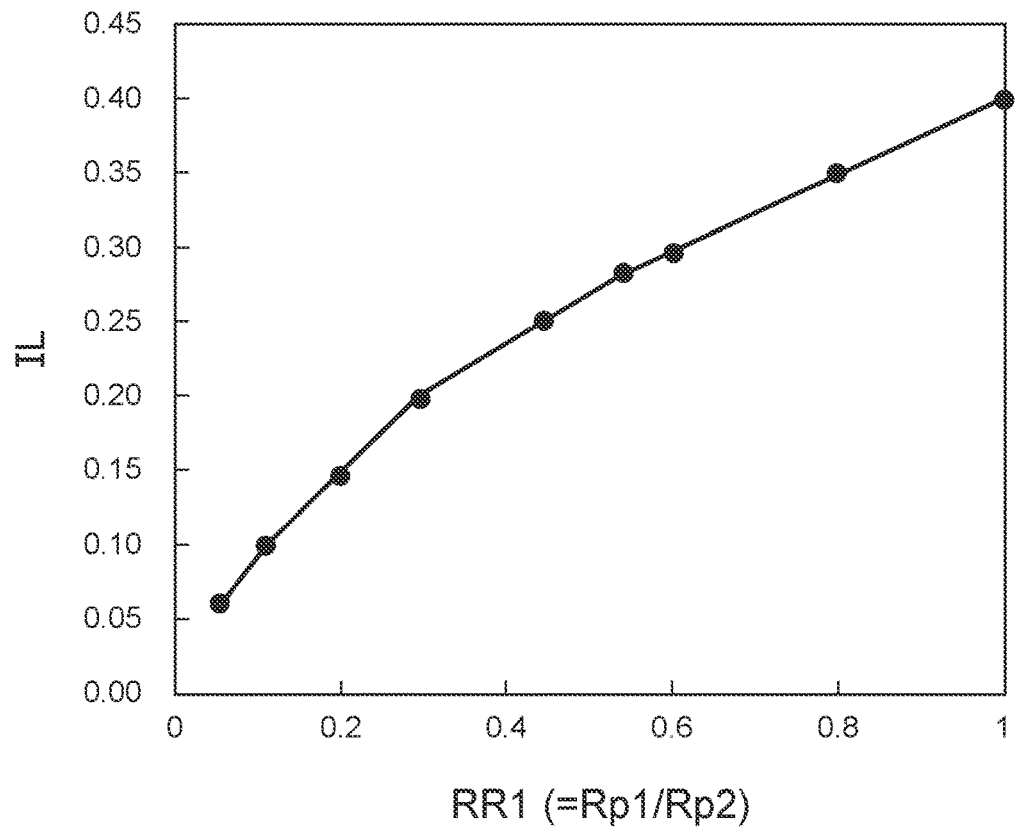
FIG. 4 is a graph illustrating a characteristic of the electronic circuit according to the first embodiment.

FIG. 4 is a graph illustrating a characteristic of the electronic circuit according to the first embodiment.

The horizontal axis of FIG. 4 is a ripple ratio RR1. The ripple ratio RR1 is the ratio (Rp1/Rp2) of the magnitude Rp1 of the first ripple R1 to the magnitude Rp2 of the second ripple R2. The vertical axis of FIG. 4 is an insertion loss IL of the band-pass filter 50 in a frequency band (the passband 50pb) including the frequency of the first readout resonator 21.

As shown in FIG. 4, the insertion loss IL increases as the ripple ratio RR1 increases. In practice, it is favorable for the insertion loss IL to be not more than 0.1. According to the embodiment, it is favorable for the ripple ratio RR1 to be not more than 1/10. The ripple ratio RR1 may be not more than 0.05. A smaller insertion loss IL is obtained.

The embodiment includes the first passband w1 having a small ripple and the second passband w2 having a large ripple. The band-pass filter 50 that has such a characteristic is applicable to the first circuit 31 having various configurations. For example, according to the design concept of the first reference example described above, it is necessary to modify the coupling coefficient of resonators when the first circuit 31 design is different. In the first reference example, it is necessary to modify the design of the band-pass filter 50.

In contrast, according to the embodiment, it is sufficient for the first passband w1 that has a small ripple to be applicable to the first circuits 31 of various characteristics. The band-pass filter 50 according to the embodiment is compatible with the first circuits 31 of various designs. For example, high design efficiency is obtained.

The characteristics of the band-pass filter 50 such as those described above are obtained by appropriately controlling the coupling magnitudes (e.g., the coupling coefficients) of the multiple filter resonators 58r.

As shown in FIG. 1, the band-pass filter 50 includes multiple coupling coefficients kx. One of the multiple coupling coefficients kx is the coupling coefficient of two adjacent filter resonators included in the multiple filter resonators 58r. For example, the multiple coupling coefficients kx include a first coupling coefficient k(1), a second coupling coefficient k(2), . . . , and an (N–1)th coupling coefficient k(N–1).

The first coupling coefficient k(1) is the coupling coefficient between the first filter resonator R(1) and the second filter resonator R(2). The second coupling coefficient k(2) is the coupling coefficient between the second filter resonator R(2) and the third filter resonator R(3). The (N–1)th coupling coefficient k(N–1) is the coupling coefficient between the (N–1)th filter resonator R(N–1) and the Nth filter resonator R(N). The (i–1)th coupling coefficient k(i–1) is the coupling coefficient between the (i–1)th filter resonator R(i–1) and the ith filter resonator R(i). "I" is an integer not less than 1 and not more than N.

According to the embodiment, when the number (N) of the multiple filter resonators 58r is even, the difference between the minimum value of the multiple coupling coefficients kx and the maximum value of the multiple coupling coefficients kx is not more than 0.1 times the average value of the multiple coupling coefficients kx. For example, the multiple coupling coefficients kx are substantially the same. The first passband w1, the second passband w2, and the third passband w3 described above are effectively obtained by such a configuration. An example is described below in which the number (N) of the multiple filter resonators 58r is odd.

As shown in FIG. 1, the band-pass filter 50 includes a first part external Qe. The first part external Qe is the external Q between the first part 61P and one of the multiple filter resonators 58r (in the example, the first filter resonator R(1)) couplable with the first part 61P. The "external Q" (the external Q-factor) indicates the coupling degree between the external circuit and the filter resonator. For example, the "external Q" (the external Q-factor) corresponds to the ratio of the resonant frequency to the bandwidth.

In the example as shown in FIG. 1, the band-pass filter 50 includes a second part external Qf. The second part external Qf is the external Q between the second part 62P and another one of the multiple filter resonators 58r (in the example, the Nth filter resonator R(N)) couplable with the second part 62P.

The multiple coupling coefficients kx may be different from the first part external Qe. The multiple coupling coefficients kx may be different from the second part external Qf. For example, the second part external Qf may be substantially equal to the first part external Qe.

Figure 5:
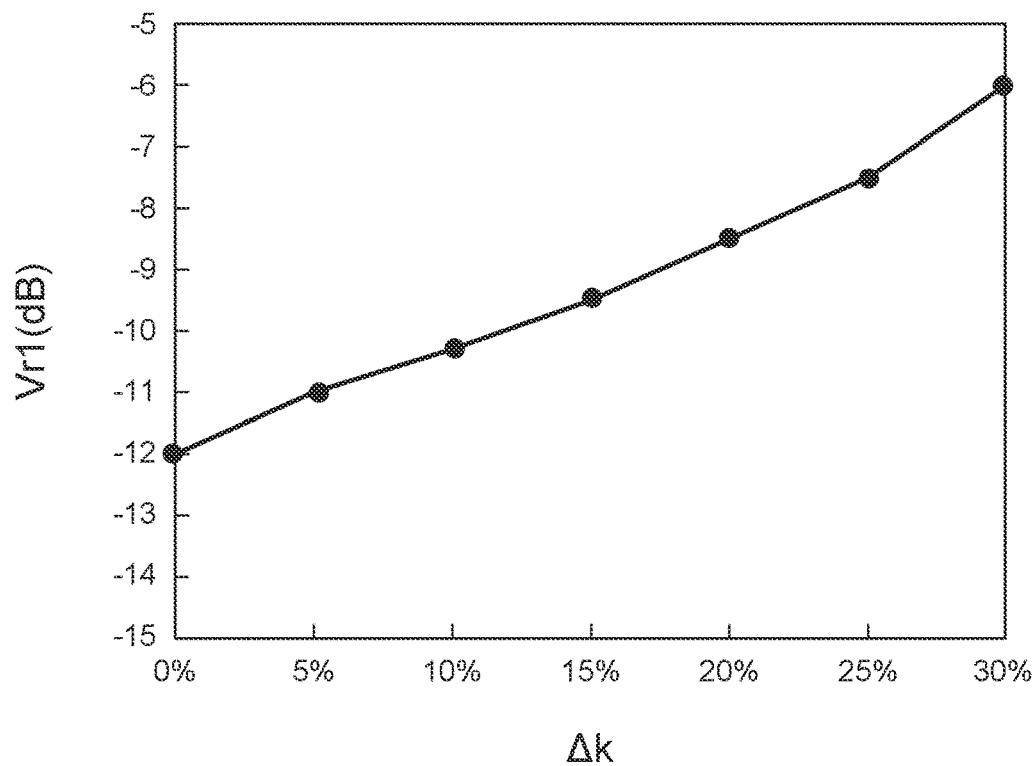
FIG. 5 is a graph illustrating a characteristic of the electronic circuit according to the first embodiment.

FIG. 5 is a graph illustrating a characteristic of the electronic circuit according to the first embodiment.

FIG. 5 corresponds to when the number (N) of the multiple filter resonators 58r is even. The horizontal axis of FIG. 5 is a coupling coefficient difference Δk. The coupling coefficient difference Δk is the ratio of the difference between the minimum value of the multiple coupling coefficients kx and the maximum value of the multiple coupling coefficients kx to the average value of the multiple coupling coefficients kx. The vertical axis of FIG. 5 is a worst value Vr1 (dB) of the reflection characteristic in the passband 50*pb* of the band-pass filter 50. It is favorable for the worst value Vr1 of the reflection characteristic to be small.

As shown in FIG. 5, the worst value Vr1 of the reflection characteristic increases as the coupling coefficient difference Δk increases. In practice, it is favorable for the worst value Vr1 of the reflection characteristic to be not more than −10 dB. Accordingly, it is favorable for the coupling coefficient difference Δk to be not more than 10%. In other words, it is favorable for the difference between the minimum value of the multiple coupling coefficients kx and the maximum value of the multiple coupling coefficients kx to be not more than 1/10 of the average value of the multiple coupling coefficients kx.

Examples of simulation results of characteristics of the electronic circuit 110 will now be described.

FIG. 6A, FIG. 6B, FIG. 7A, FIG. 7B, FIG. 8A, FIG. 8B, FIG. 9A, and FIG. 9B are graphs illustrating characteristics of the electronic circuit.

These figures illustrate characteristics of the band-pass filter 50. In these figures, the horizontal axis is the frequency fr1. FIG. 6A, FIG. 7A, FIG. 8A, and FIG. 9A illustrate a transmission characteristic S21. FIG. 6B, FIG. 7B, FIG. 8B, and FIG. 9B illustrate a reflection characteristic S11. In these examples, the multiple coupling coefficients kx are the same, i.e., 0.053. The first part external Qe is 20.0. The second part external Qf is 20.0. In these examples, the number (N) of the multiple filter resonators 58*r* is even.

Figure 6A:
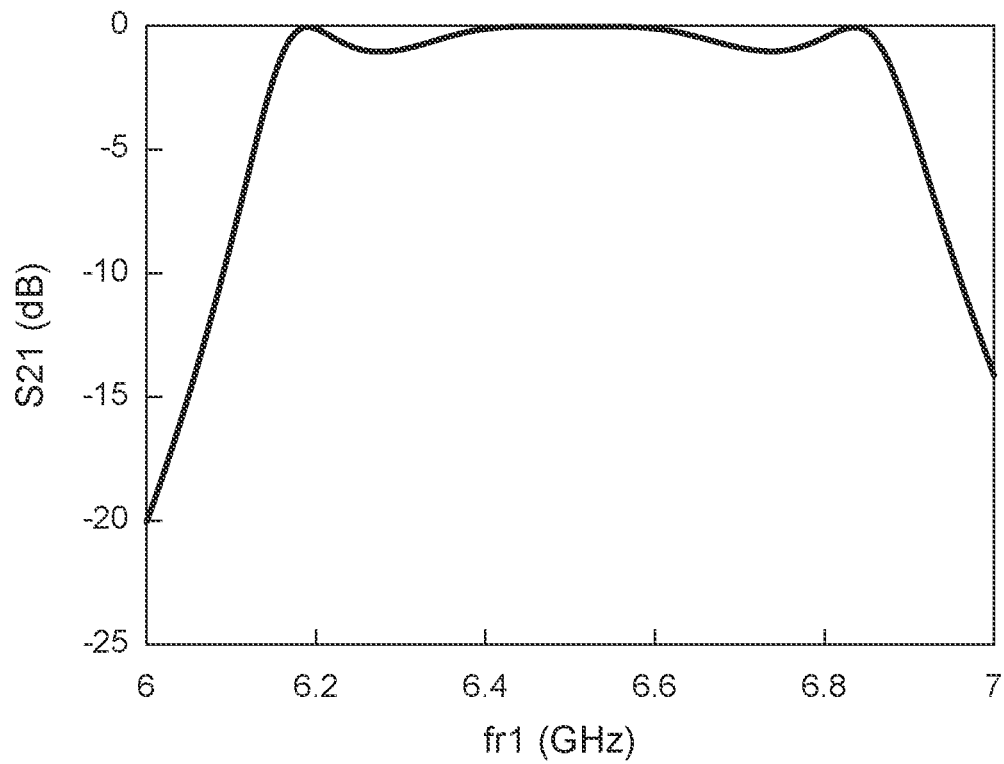
FIGS. 6A and 6B are graphs illustrating characteristics of the electronic circuit.
Figure 6B:
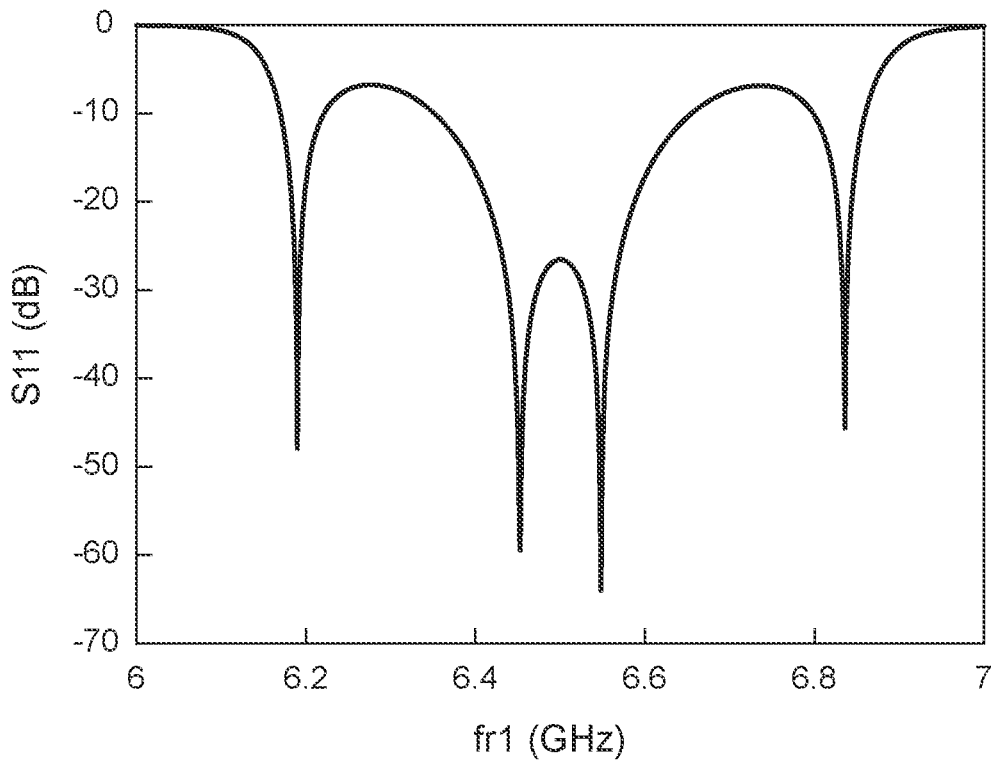

In FIGS. 6A and 6B, the number (N) of the multiple filter resonators 58*r* is 4. In the example, the ripple ratio RR1 (i.e., Rp1/Rp2) is 0.016.

Figure 7A:
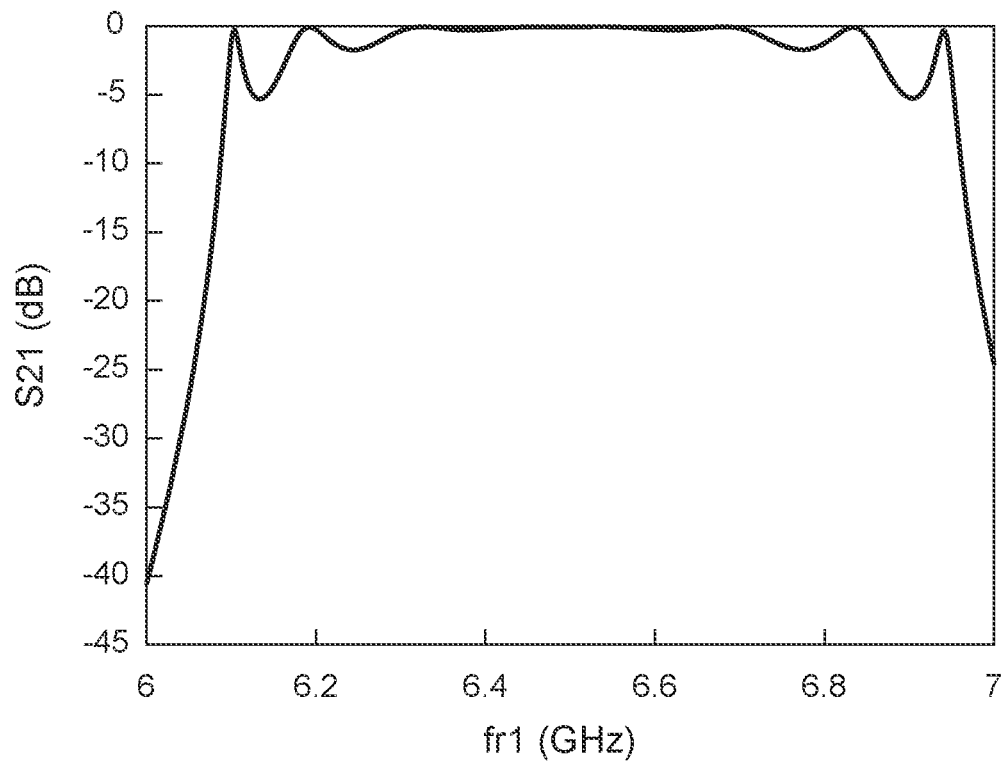
FIGS. 7A and 7B are graphs illustrating characteristics of the electronic circuit.
Figure 7B:
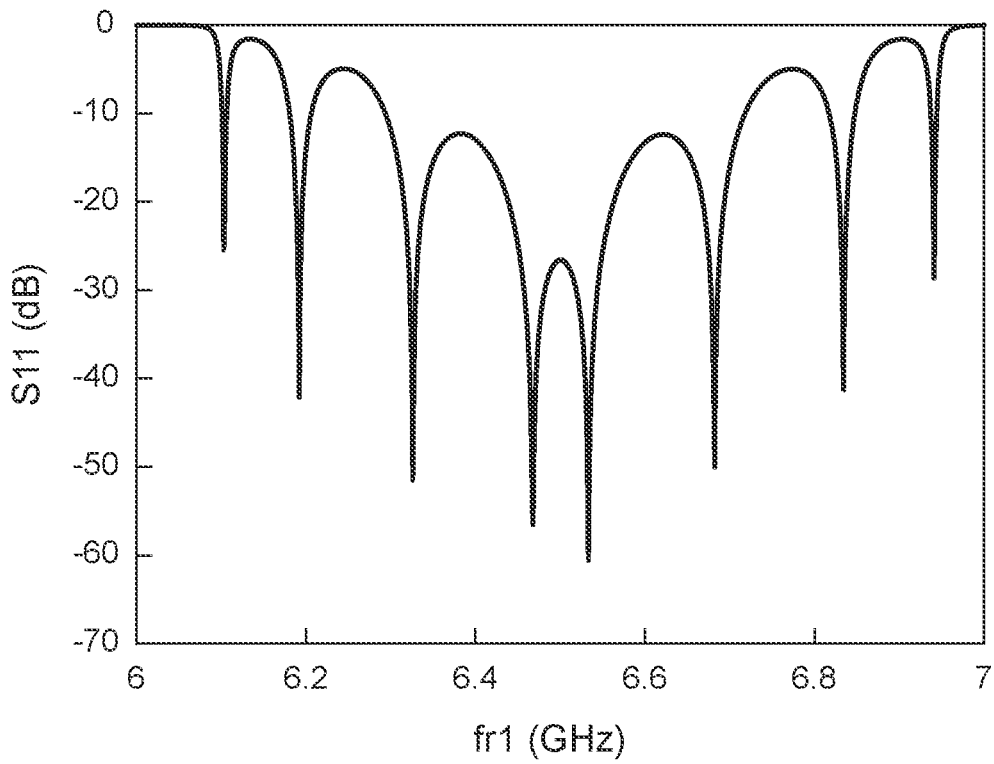

In FIGS. 7A and 7B, the number (N) of the multiple filter resonators 58*r* is 8. In the example, the ripple ratio RR1 is 0.006.

Figure 8A:
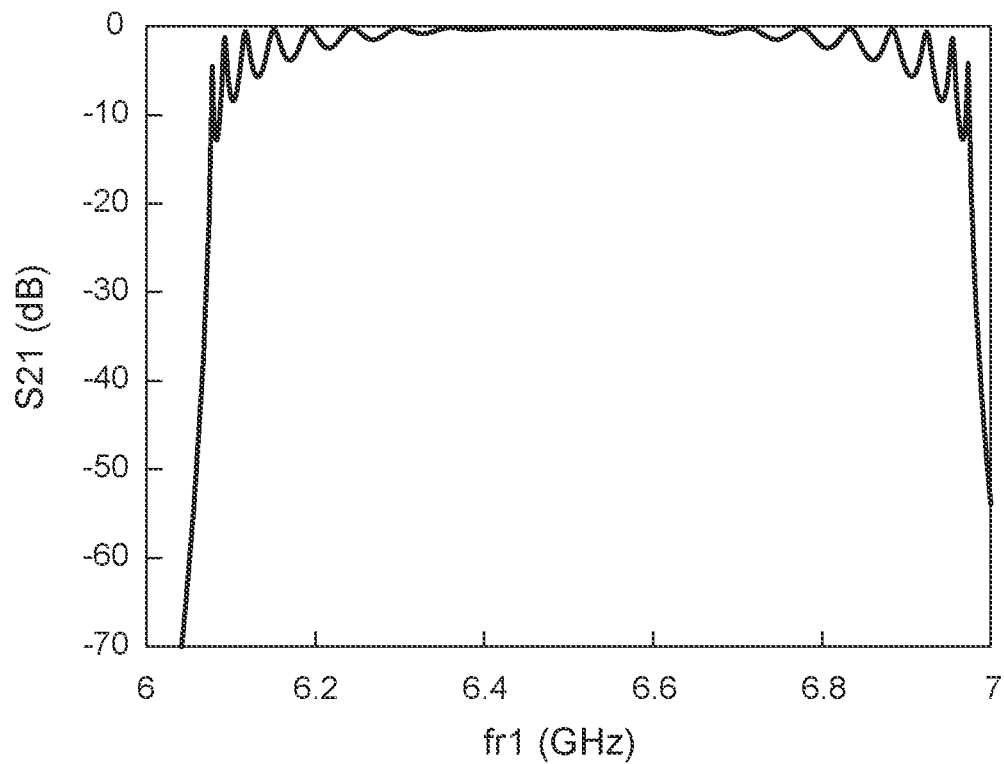
FIGS. 8A and 8B are graphs illustrating characteristics of the electronic circuit.
Figure 8B:
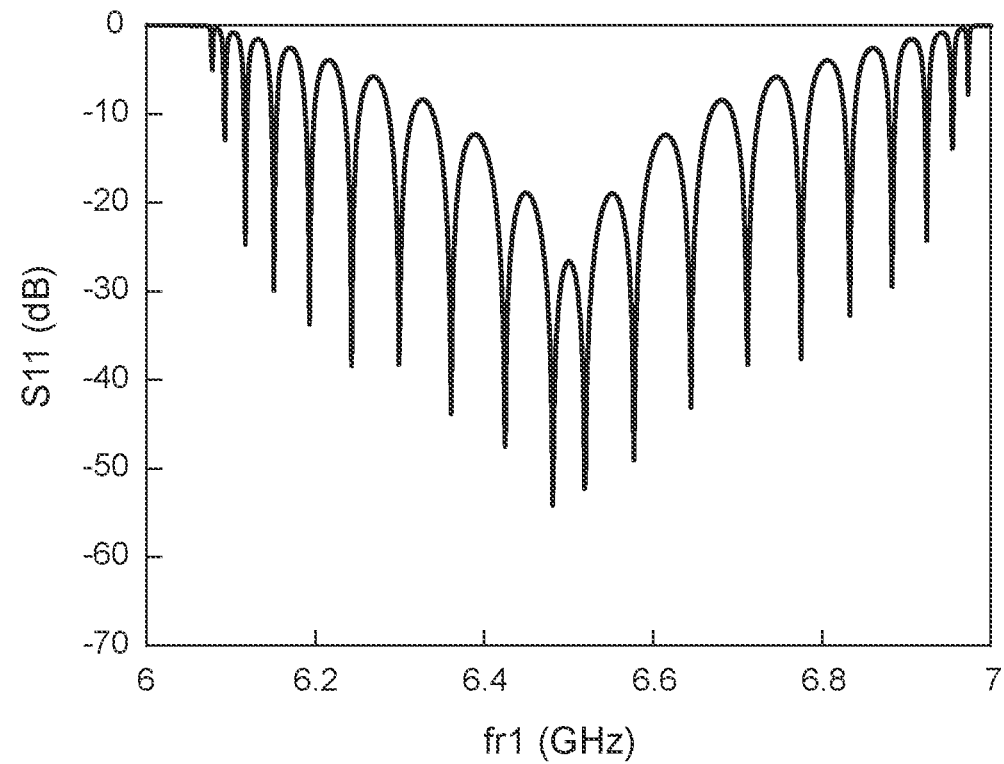

In FIGS. 8A and 8B, the number (N) of the multiple filter resonators 58*r* is 20. In the example, the ripple ratio RR1 is 0.005.

Figure 9A:
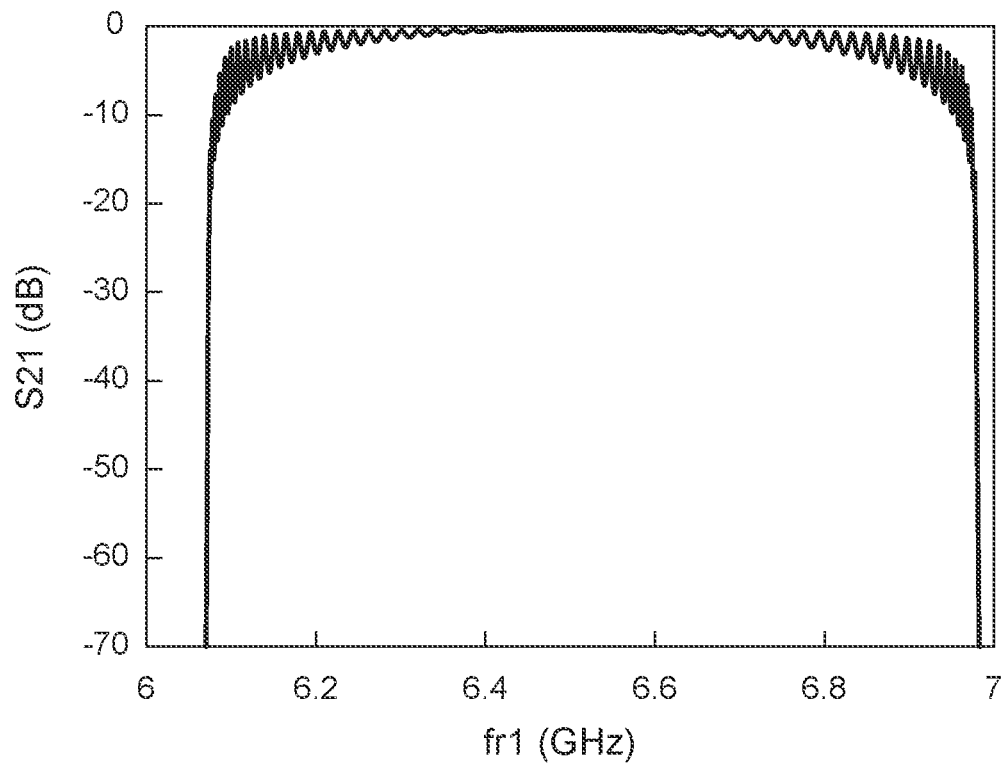
FIGS. 9A and 9B are graphs illustrating characteristics of the electronic circuit.
Figure 9B:
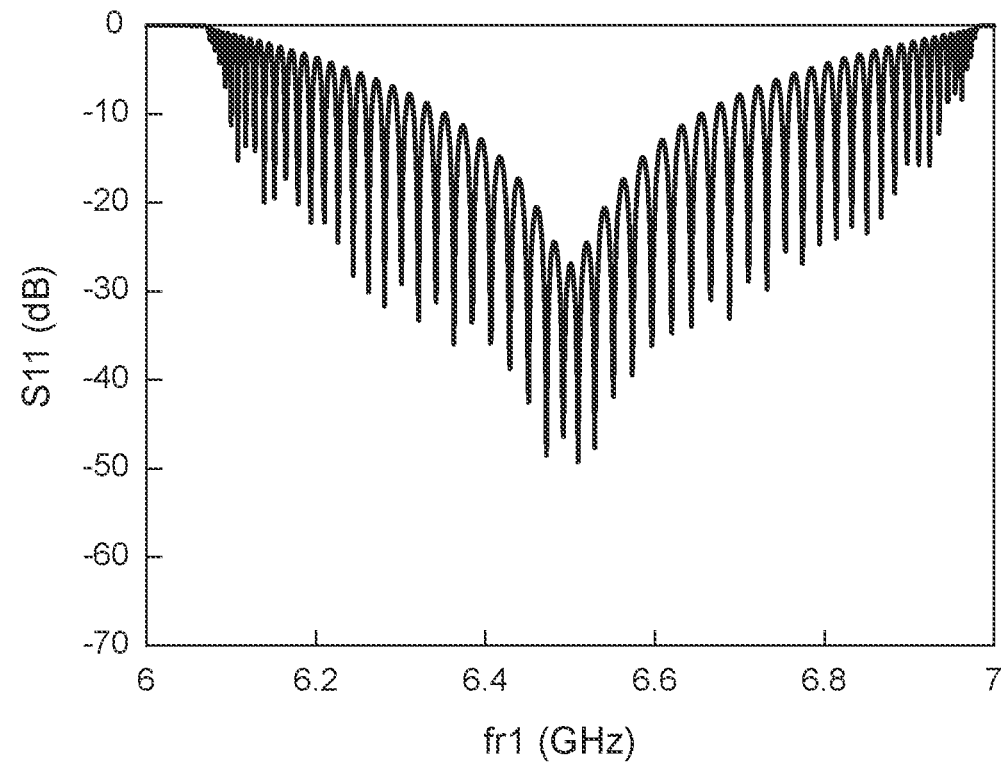

In FIGS. 9A and 9B, the number (N) of the multiple filter resonators 58*r* is 80. In the example, the ripple ratio RR1 is 0.005.

The steepness of the change between the passband 50*pb* and the non-pass band (e.g., the low-frequency non-pass band 501*b*) increases as the number (N) of the multiple filter resonators 58*r* increases.

According to the embodiment, when the number (N) of the multiple filter resonators 58*r* is even, an appropriate first passband w1, an appropriate second passband w2, and an appropriate third passband w3 are easily obtained by appropriately setting the multiple coupling coefficients kx.

Figure 10A:
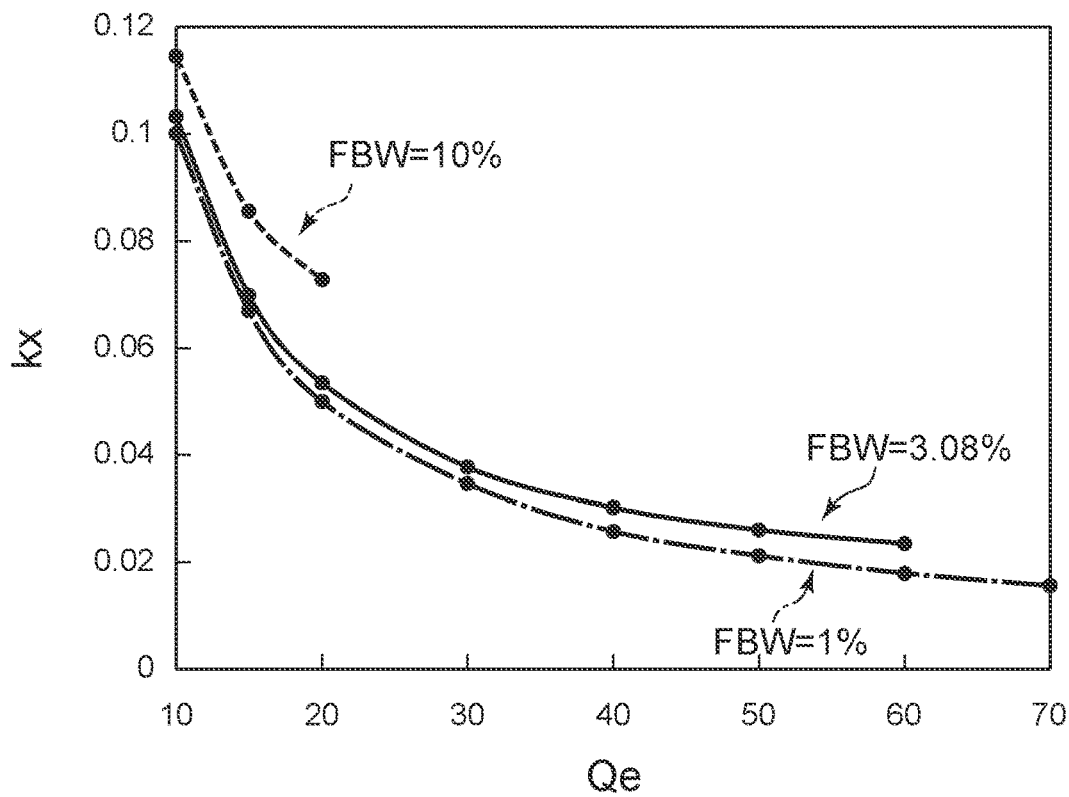
FIGS. 10A and 10B are graphs illustrating characteristics of the electronic circuit.
Figure 10B:
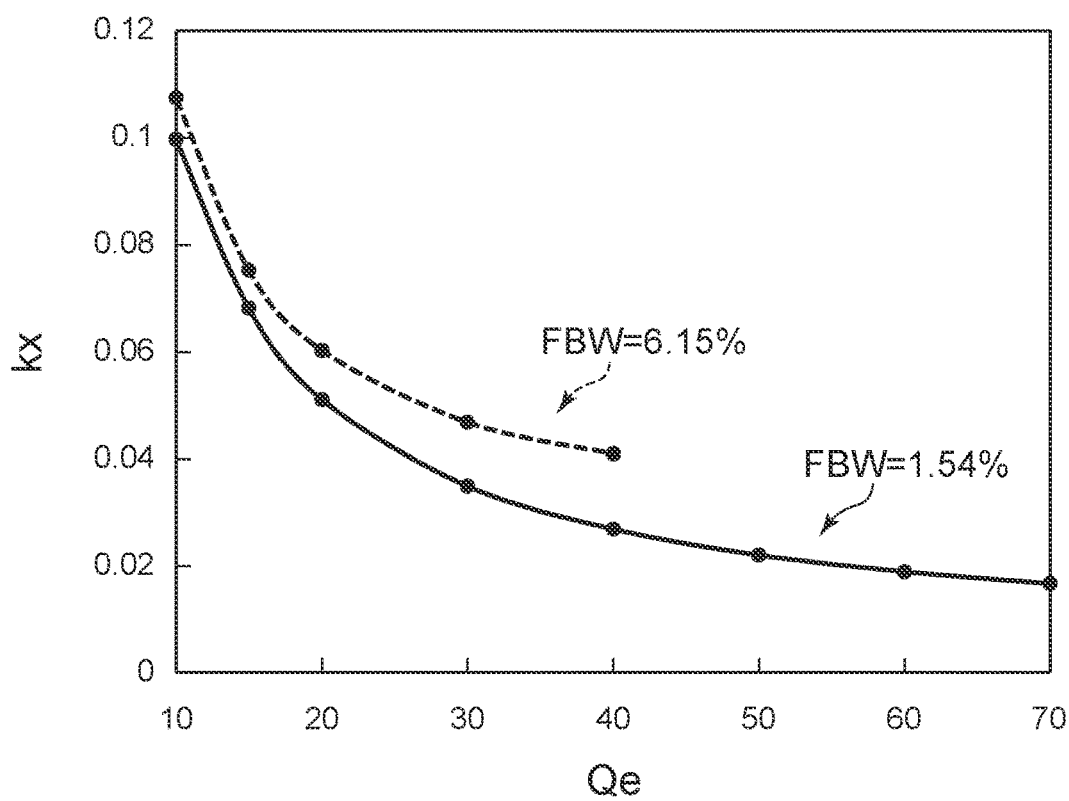

FIGS. 10A and 10B are graphs illustrating characteristics of the electronic circuit.

These figures illustrate simulation results when the multiple coupling coefficients kx are changed. In the example, the second part external Qf is equal to the first part external Qe. In these figures, the horizontal axis is the first part external Qe. In these figures, the vertical axis is the multiple coupling coefficients kx.

In these figures, a parameter FBW is modified. The parameter FBW is the ratio of the product of the frequency width (the line width 21*w*) of the multiple resonant frequencies 21*p* and the number of the multiple resonant frequencies 21*p* to a center frequency f0 of the passband 50*pb* (see FIG. 2A). In practice, it is favorable for the parameter FBW to be not more than 10%. For example, the number of the multiple first circuits 31 can be increased. By setting the parameter FBW to be not more than 10%, the width of the first passband w1 is prevented from becoming excessively large.

For example, the out-of-band suppression amount Δ50 can be increased by the first passband w1 having an appropriate width. For example, the steepness of the change of the characteristic between the passband 50*pb* and the non-pass band can be increased. The parameter FBW may be, for example, not less than 1%. The parameter FBW may be, for example, not less than 0.1%.

FIG. 10A shows an example in which the parameter FBW is 1%, 3.08%, and 10%. FIG. 10B shows an example in which the parameter FBW is 1.54% and 6.15%.

The characteristic when the parameter FBW illustrated in FIG. 10A is 1% is approximately represented by the following first formula.

$$Kx=(2\times10^{-7})\times Qe^4-(2\times10^{-5})\times Qe^3+0.0009\times Qe^2-0.0211\times Qe+0.2361 \quad (1)$$

The characteristic when the parameter FBW illustrated in FIG. 10A is 10% is approximately represented by the following first formula.

$$Kx=0.0003\times Qe^2-0.014\times Qe+0.2216 \quad (2)$$

Accordingly, according to the embodiment, when the number (N) of the multiple filter resonators 58*r* is even, it is favorable for one of the multiple coupling coefficients kx (each of the multiple coupling coefficients kx) to be not less than a first value and not more than a second value. The first value is $(2\times10^{-7})\times Qe^4-(2\times10^{-5})\times Qe^3+0.0009\times Qe^2-0.0211\times Qe+0.2361$. The second value is $0.0003\times Qe^2-0.014\times Qe+0.2216$.

The first passband w1 that has a small ripple is appropriately obtained by such multiple coupling coefficients kx.

For example, the second part 62P may be included. In such a case, it is favorable for one of the multiple coupling coefficients kx (each of the multiple coupling coefficients kx) to be not less than a third value and not more than a fourth value. The third value is $(2\times10^{-7})\times Qf^4-(2\times10^{-5})\times Qf^3+0.0009\times Qf^2-0.0211\times Qf+0.2361$. The fourth value is $0.0003\times Qf^2-0.014\times Qf+0.2216$.

As described above, when the number (N) of the multiple filter resonators 58*r* is even, the multiple coupling coefficients kx can be set to be substantially equal. In one example, the multiple filter resonators 58*r* may be set to be substantially the same. Thereby, the multiple coupling coefficients kx can be set to be substantially equal.

Figure 11:
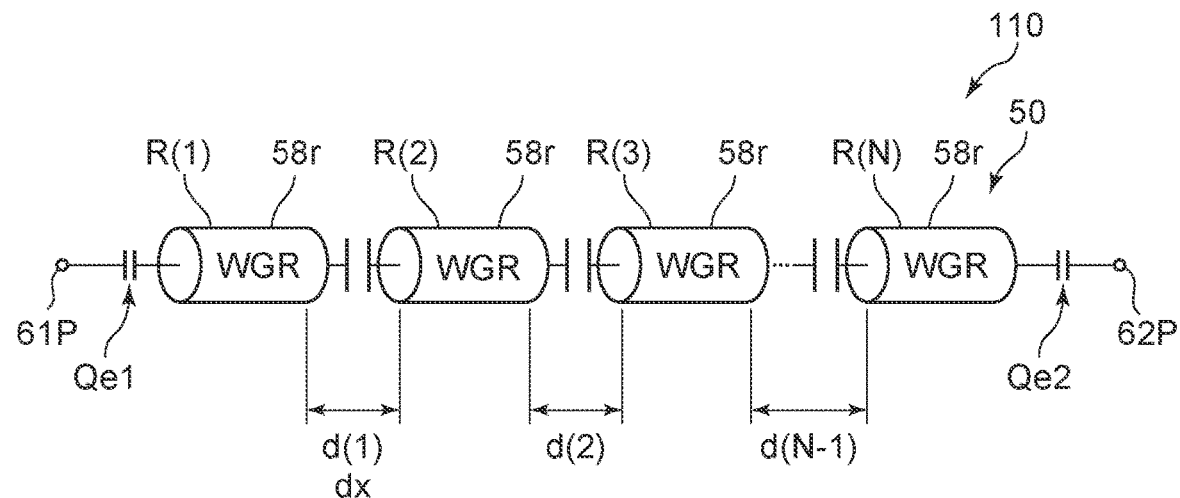
FIG. 11 is a schematic view illustrating the electronic circuit according to the first embodiment.

FIG. 11 is a schematic view illustrating the electronic circuit according to the first embodiment. As shown in FIG. 11, the band-pass filter 50 includes multiple distances dx. One of the multiple distances dx is the distance between two adjacent filter resonators 58*r* included in the multiple filter resonators 58*r*. For example, the multiple distances dx include a first distance d(1), a second distance d(2), ..., and an (N−1)th distance d(N−1). The (i−1)th distance d(i−1) is the distance between the (i−1)th filter resonator R(i−1) and the ith filter resonator R(i). "i" is an integer not less than 1 and not more than N.

When the number (N) of the multiple filter resonators 58*r* is even, it is favorable for the difference between the minimum value of the multiple distances dx and the maximum value of the multiple distances dx to be not more than 0.1 times the average value of the multiple distances dx. The first passband w1 that has a small ripple is appropriately obtained by the uniform multiple distances dx.

It was found that when the number (N) of the multiple filter resonators 58*r* is odd, the first passband w1 that has a small ripple is appropriately obtained by causing the coupling coefficient kx of a portion of the multiple filter resonators 58*r* to be different from the other coupling coefficient kx.

Figure 12:
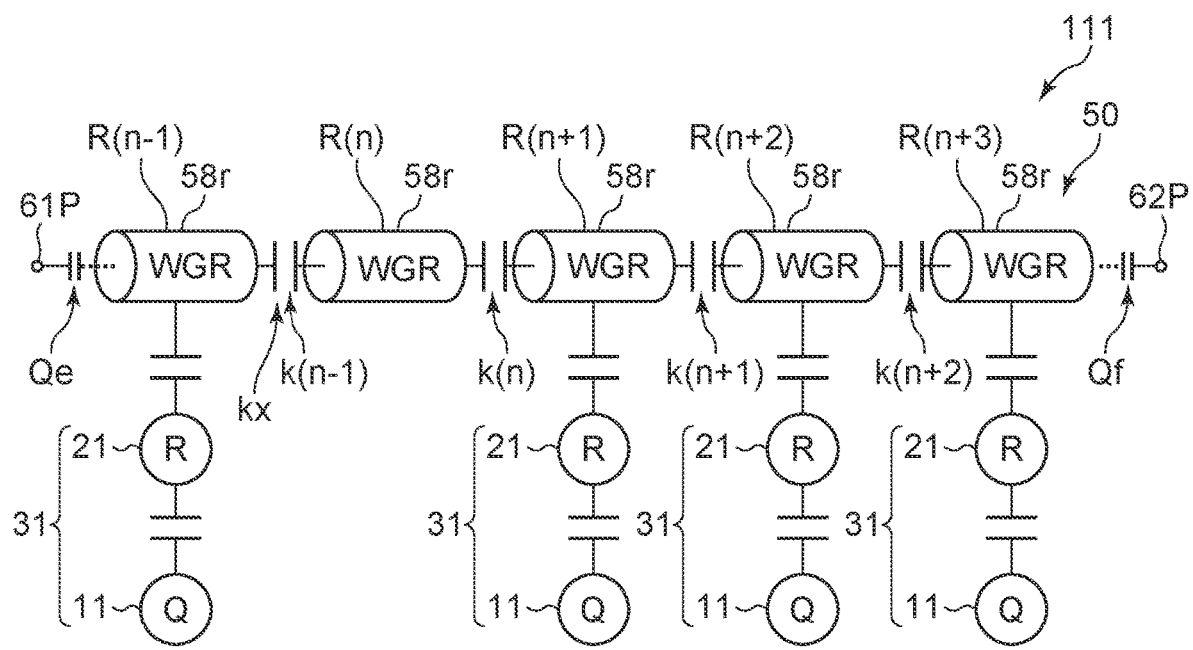
FIG. 12 is a schematic view illustrating an electronic circuit according to the first embodiment.

FIG. 12 is a schematic view illustrating an electronic circuit according to the first embodiment.

In the electronic circuit 111 according to the embodiment shown in FIG. 12 as well, the band-pass filter 50 includes the multiple filter resonators 58r. Two adjacent filter resonators 58r included in the multiple filter resonators 58r are mutually couplable. The first circuit 31 includes the first qubit 11 and the first readout resonator 21. The first readout resonator 21 is couplable with the first qubit 11 and one of the multiple filter resonators 58r.

In the electronic circuit 111, the number (N) of the multiple filter resonators 58r is odd. The multiple filter resonators 58r include the first to Nth filter resonators R(1) to R(N). "N" is (2n+1). "n" is an integer not less than 2. For example, the number (N) of the multiple filter resonators 58r is an odd number not less than 5.

Figure 13:
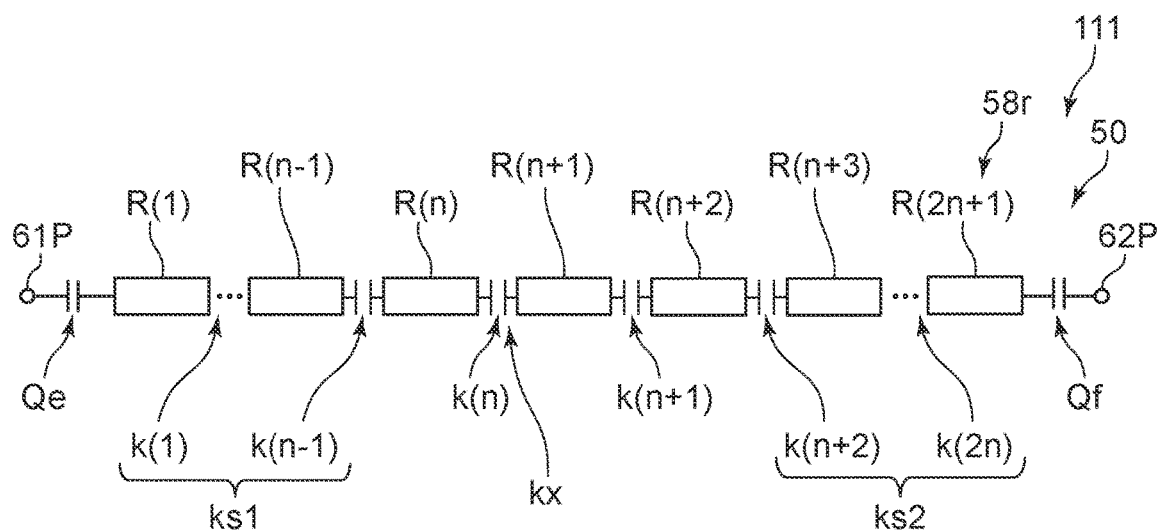
FIG. 13 is a schematic view illustrating the electronic circuit according to the first embodiment.

FIG. 13 is a schematic view illustrating the electronic circuit according to the first embodiment.

The first circuits 31 are not illustrated in FIG. 13. The multiple filter resonators 58r include an (n−1)th filter resonator R(n−1), an nth filter resonator R(n), an (n+1)th filter resonator R(n+1), an (n+2)th filter resonator R(n+2), and an (n+3)th filter resonator R(n+3). The (n+1)th filter resonator R(n+1) is the filter resonator 58r at the middle of the multiple filter resonators 58r.

The coupling coefficient between the (n−1)th filter resonator R(n−1) and the nth filter resonator R(n) is the (n−1)th coupling coefficient k(n−1). The coupling coefficient between the nth filter resonator R(n) and the (n+1)th filter resonator R(n+1) is the nth coupling coefficient k(n). The coupling coefficient between the (n+1)th filter resonator R(n+1) and the (n+2)th filter resonator R(n+2) is the (n+1)th coupling coefficient k(n+1). The coupling coefficient between the (n+2)th filter resonator R(n+2) and the (n+3)th filter resonator R(n+3) is the (n+2)th coupling coefficient k(n+2).

In the electronic circuit 111, the nth coupling coefficient k(n) is different from the (n−1)th coupling coefficient k(n−1). The (n+1)th coupling coefficient k(n+1) is different from the (n+2)th coupling coefficient k(n+2). The (n+2)th coupling coefficient k(n+2) is substantially equal to the (n−1)th coupling coefficient k(n−1). For example, the coupling coefficient kx between the (n+1)th filter resonator R(n+1) positioned at the middle and the adjacent filter resonators 58r is set to be less than the other coupling coefficient kx.

For example, it is favorable for the nth coupling coefficient k(n) to be not less than 0.7 times but less than 0.9 times the (n−1)th coupling coefficient k(n−1). For example, it is favorable for the nth coupling coefficient k(n) to be not less than 0.7 times but less than 0.9 times the (n+2)th coupling coefficient k(n+2).

For example, it is favorable for the (n+1)th coupling coefficient k(n+1) to be not less than 0.7 times but less than 0.9 times the (n−1)th coupling coefficient k(n−1). For example, it is favorable for the (n+2)th coupling coefficient k(n+2) to be not less than 0.7 times but less than 0.9 times. By such a coupling coefficient kx, the first passband w1 that has a small ripple is appropriately obtained when the number (N) of the multiple filter resonators 58r is odd.

The nth coupling coefficient k(n) may be substantially equal to the (n+1)th coupling coefficient k(n+1). The nth coupling coefficient k(n) may be, for example, not less than 0.95 times and not more than 1.05 times the (n+1)th coupling coefficient k(n+1). The (n−1)th coupling coefficient k(n−1) may be substantially equal to the (n+2)th coupling coefficient k(n+2). The coupling coefficient k(n−1) may be not less than 0.95 times and not more than 1.05 times the (n+2)th coupling coefficient k(n+2).

For example, in the electronic circuit 111, "n" may be not less than 3. For example, the number (N) of the multiple filter resonators 58r is not less than 7.

As shown in FIG. 13, the band-pass filter 50 includes multiple first-type coupling coefficients ks1 and multiple second-type coupling coefficients ks2. One of the multiple first-type coupling coefficients ks1 is the coupling coefficient between two adjacent filter resonators included in the first to nth filter resonators R(1) to R(n). The multiple first-type coupling coefficients ks1 are the first to (n−1)th coupling coefficients k(1) to k(n−1). The difference between the minimum value of the multiple first-type coupling coefficients ks1 and the maximum value of the multiple first-type coupling coefficients ks1 is not more than 0.1 times the average value of the multiple first-type coupling coefficients ks1. For example, the multiple first-type coupling coefficients ks1 are substantially equal.

One of the multiple second-type coupling coefficients ks2 is the coupling coefficient between two adjacent filter resonators included in the (n+2)th to (2n+1)th filter resonators R(n+2) to R(2n+1). The multiple second-type coupling coefficients ks2 include the (n+2)th to (2n)th coupling coefficients k(n+2) to k(2n). The difference between the minimum value of the multiple second-type coupling coefficients ks2 and the maximum value of the multiple second-type coupling coefficients ks2 is not more than 0.1 times the average value of the multiple second-type coupling coefficients ks2. For example, the multiple second-type coupling coefficients ks2 are substantially equal.

When the number (N) of the multiple filter resonators 58r is an odd number not less than 7, the first passband w1 that has a small ripple is effectively obtained by using the multiple first-type coupling coefficients ks1 that are substantially equal and the multiple second-type coupling coefficients ks2 that are substantially equal.

Figure 14:
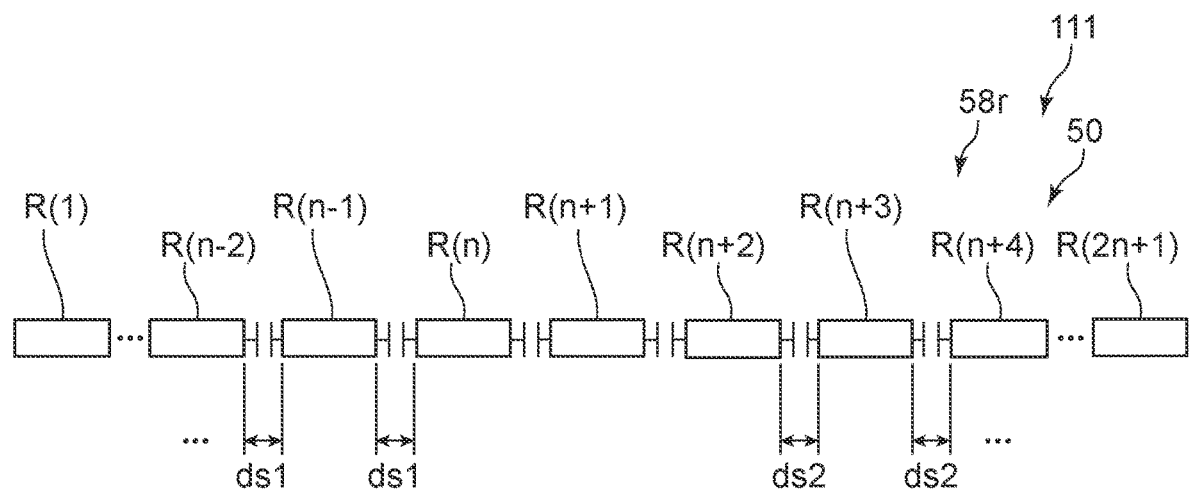
FIG. 14 is a schematic view illustrating the electronic circuit according to the first embodiment.

FIG. 14 is a schematic view illustrating the electronic circuit according to the first embodiment.

In the electronic circuit 111 as shown in FIG. 14, the band-pass filter 50 includes multiple first-type distances ds1 and multiple second-type distances ds2.

One of the multiple first-type distances ds1 is the distance between two adjacent filter resonators included in the first to nth filter resonators R(1) to R(n). The difference between the minimum value of the multiple first-type distances ds1 and the maximum value of the multiple first-type distances ds1 is not more than 0.1 times the average value of the multiple first-type distances ds1. The multiple first-type distances ds1 may be substantially equal.

One of the multiple second-type distances ds2 is the distance between two adjacent filter resonators included in the (n+2)th to (2n+1)th filter resonators R(n+2) to R(2n+1). The difference between the minimum value of the multiple second-type distances ds2 and the maximum value of the multiple second-type distances ds2 is not more than 0.1 times the average value of the multiple second-type distances ds2. The multiple second-type distances ds2 may be substantially equal.

In the electronic circuit 111, the distance between the nth filter resonator R(n) and the (n+1)th filter resonator R(n+1) is less than the multiple first-type distances ds1 and less than the multiple second-type distances ds2. The distance between the (n+1)th filter resonator R(n+1) and the (n+2)th filter resonator R(n+2) is less than the multiple first-type distances ds1 and less than the multiple second-type distances ds2.

An example of simulation results of characteristics when the coupling coefficients are changed when the number (N) of the multiple filter resonators 58r is an odd number not less than 7 will now be described. In the simulation, the multiple first-type coupling coefficients ks1 are equal. The multiple second-type coupling coefficients ks2 are equal. The multiple second-type coupling coefficients ks2 are equal to the multiple first-type coupling coefficients ks1. In the simulation, the (n+1)th coupling coefficient k(n+1) is equal to the nth coupling coefficient k(n).

Figure 15:
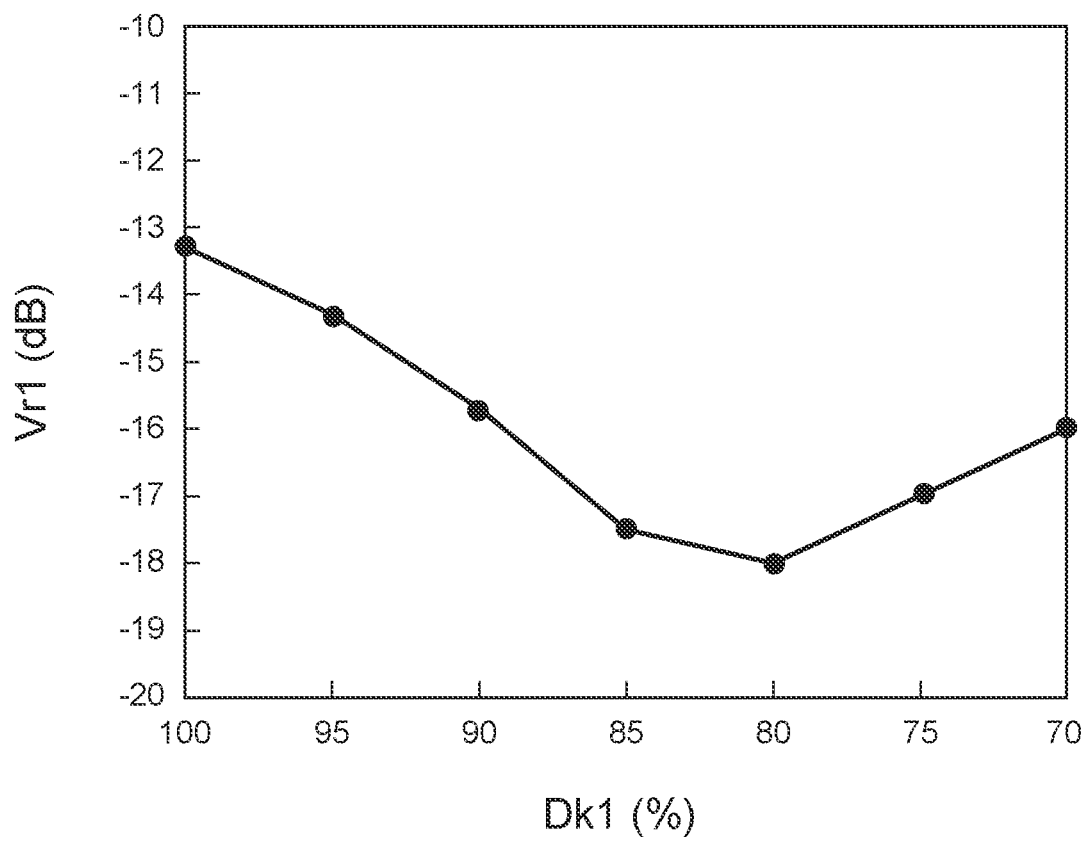
FIG. 15 is a graph illustrating a characteristic of the electronic circuit.

FIG. 15 is a graph illustrating a characteristic of the electronic circuit.

The horizontal axis of FIG. 15 is a normalized coupling coefficient difference Dk1. The normalized coupling coefficient difference Dk1 is the ratio (k(n)/ks1) of the nth coupling coefficient k(n) to the first-type coupling coefficient ks1. The vertical axis is the worst value Vr1 (dB) of the reflection characteristic in the passband 50pb of the band-pass filter 50. It is favorable for the worst value Vr1 of the reflection characteristic to be small.

As shown in FIG. 15, the worst value Vr1 of the reflection characteristic is a minimum when the normalized coupling coefficient difference Dk1 is 80%. It is favorable for the normalized coupling coefficient difference Dk1 to be, for example, not less than 70% and not more than 90%. It is more favorable for the normalized coupling coefficient difference Dk1 to be, for example, not less than 75% and not more than 85%.

In other words, for example, it is favorable for the nth coupling coefficient k(n) to be not less than 0.7 times and not more than 0.9 times the first-type coupling coefficient ks1. For example, it is more favorable for the nth coupling coefficient k(n) to be not less than 0.75 times and not more than 0.85 times the first-type coupling coefficient ks1.

For example, it is favorable for the nth coupling coefficient k(n) to be not less than 0.7 times but less than 0.9 times the (n−1)th coupling coefficient k(n−1). It is favorable for the nth coupling coefficient k(n) to be not less than 0.7 times but less than 0.9 times the (n+2)th coupling coefficient. It is favorable for the (n+1)th coupling coefficient k(n+1) to be not less than 0.7 times but less than 0.9 times the (n−1)th coupling coefficient k(n−1). It is favorable for the (n+1)th coupling coefficient k(n+1) to be not less than 0.7 times but less than 0.9 times the (n+2)th coupling coefficient.

The multiple first-type coupling coefficients ks1 and the multiple second-type coupling coefficients ks2 may be not less than the first value and not more than the second value described with reference to FIG. 10A. The first value is $(2 \times 10^{-7}) \times Qe^4 - (2 \times 10^{-5}) \times Qe^3 + 0.0009 \times Qe^2 - 0.0211 \times Qe + 0.2361$. The second value is $0.0003 \times Qe^2 - 0.014 \times Qe + 0.2216$. The multiple first-type coupling coefficients ks1 and the multiple second-type coupling coefficients ks2 may be not less than the third value and not more than the fourth value described above. The third value is $(2 \times 10^{-7}) \times Qf^4 - (2 \times 10^{-5}) \times Qf^3 + 0.0009 \times Qf^2 - 0.0211 \times Qf + 0.2361$. The fourth value is $0.0003 \times Qf^2 - 0.014 \times Qf + 0.2216$.

Figure 16A:
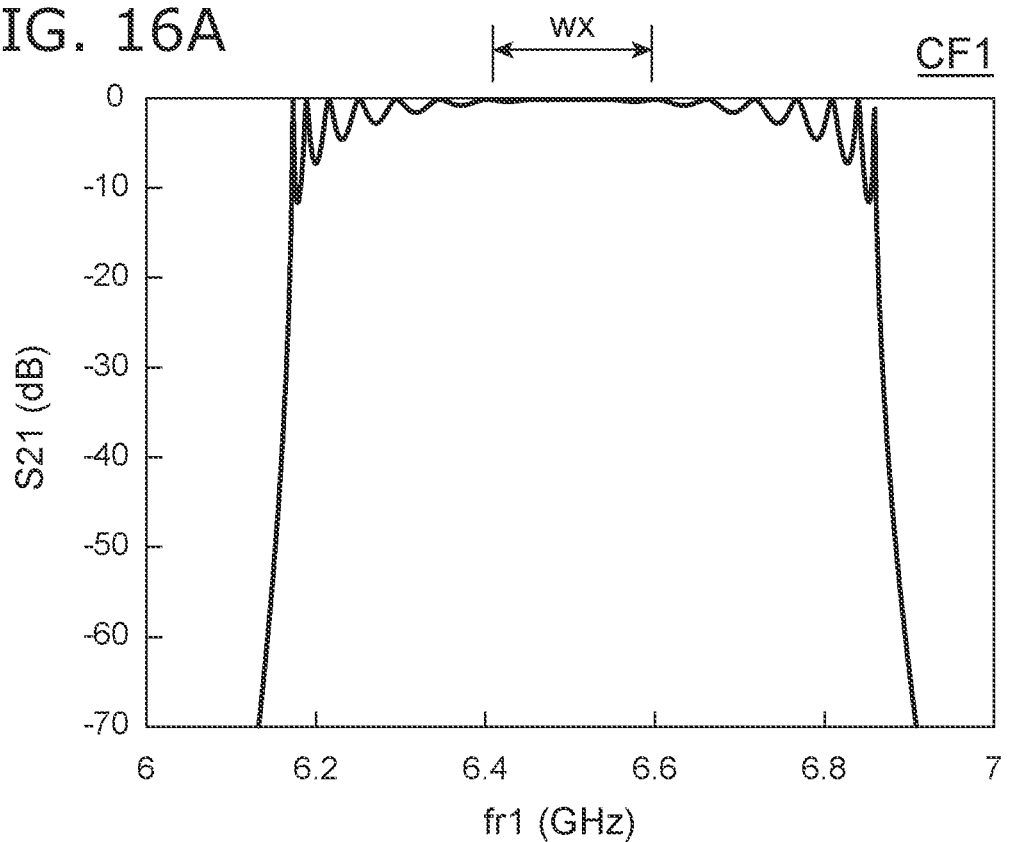
FIGS. 16A and 16B are graphs illustrating characteristics of the electronic circuit.
Figure 16B:
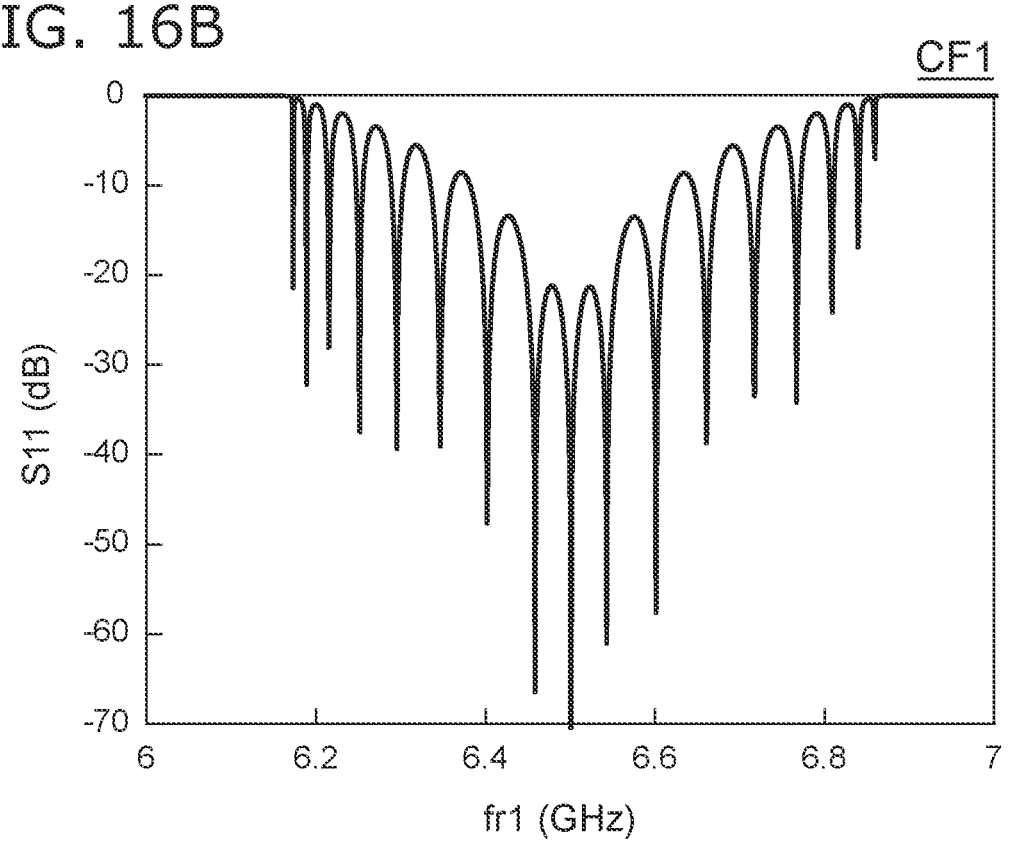

FIGS. 16A and 16B are graphs illustrating characteristics of the electronic circuit.

These figures correspond to a first configuration CF1. In the first configuration CF1, the number (N) of the multiple filter resonators 58r is 17. The nth coupling coefficient k(n) is equal to the first-type coupling coefficient ks1. The (n+1)th coupling coefficient k(n+1) is equal to the nth coupling coefficient k(n). The second-type coupling coefficient ks2 is equal to the first-type coupling coefficient ks1.

Figure 17A:
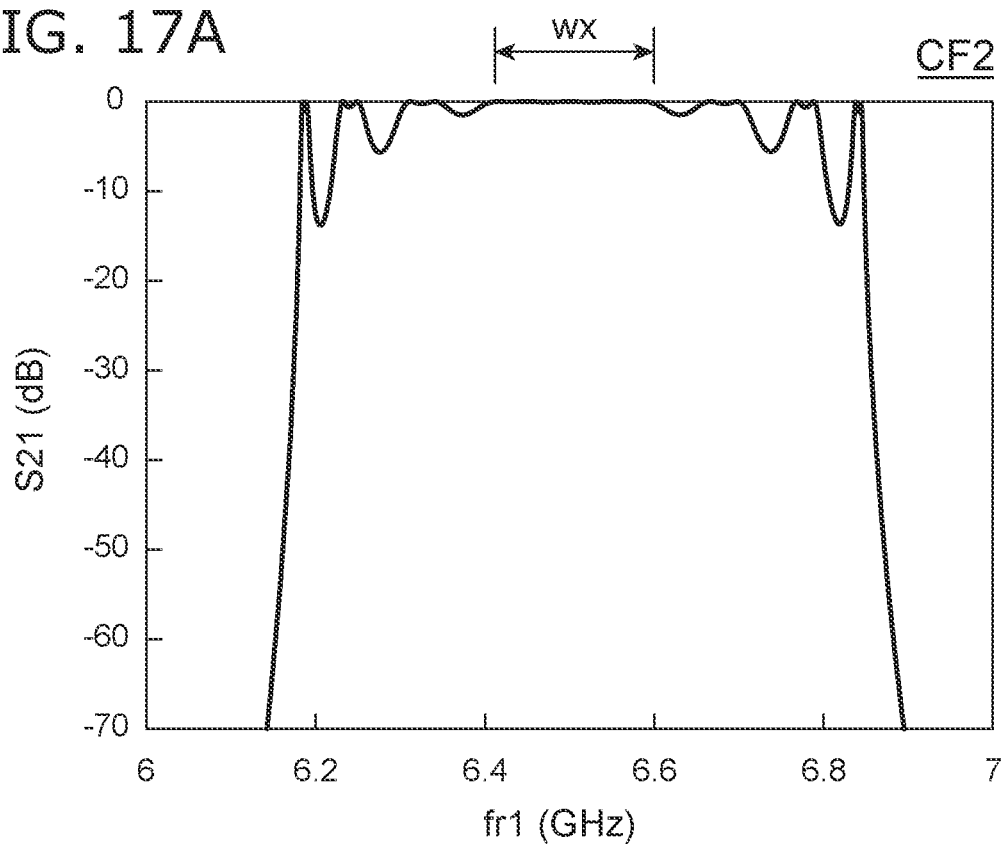
FIGS. 17A and 17B are graphs illustrating characteristics of the electronic circuit.
Figure 17B:
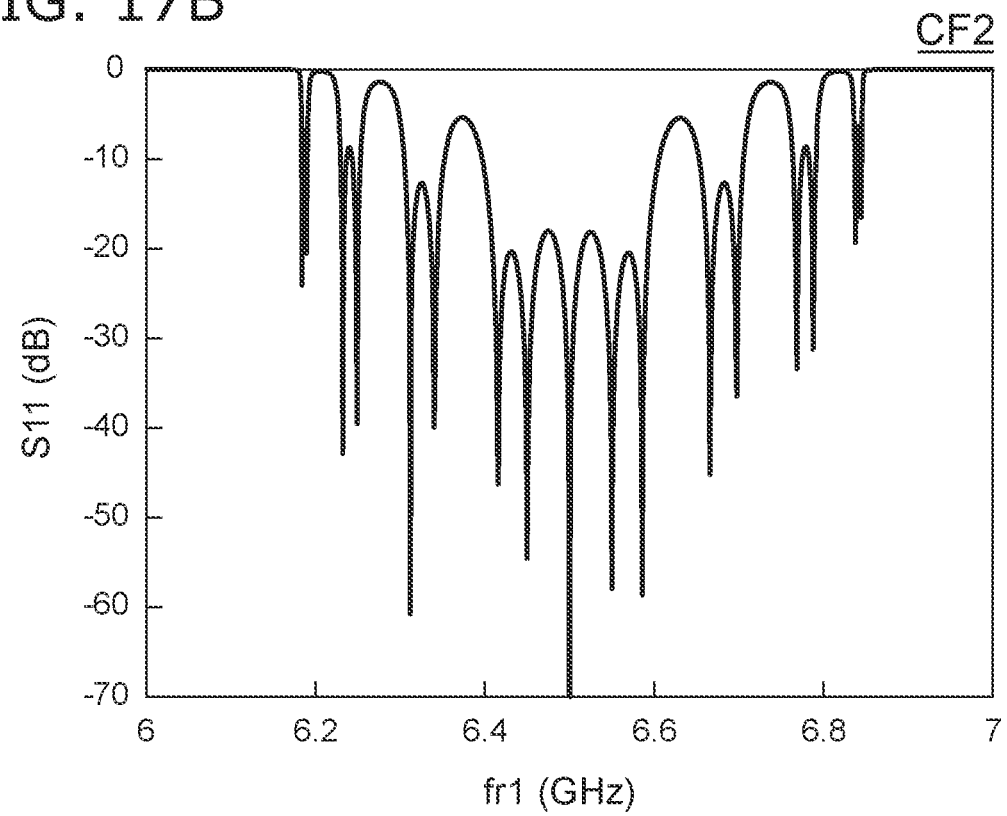

FIGS. 17A and 17B are graphs illustrating characteristics of the electronic circuit.

These figures correspond to a second configuration CF2. In the second configuration CF2, the number (N) of the multiple filter resonators 58r is 17. The nth coupling coefficient k(n) is 0.8 times the first-type coupling coefficient ks1. The (n+1)th coupling coefficient k(n+1) is equal to the nth coupling coefficient k(n). The second-type coupling coefficient ks2 is equal to the first-type coupling coefficient ks1. FIGS. 16A and 17A illustrate the transmission characteristic S21. FIGS. 16B and 17B illustrate the reflection characteristic S11.

Figure 18A:
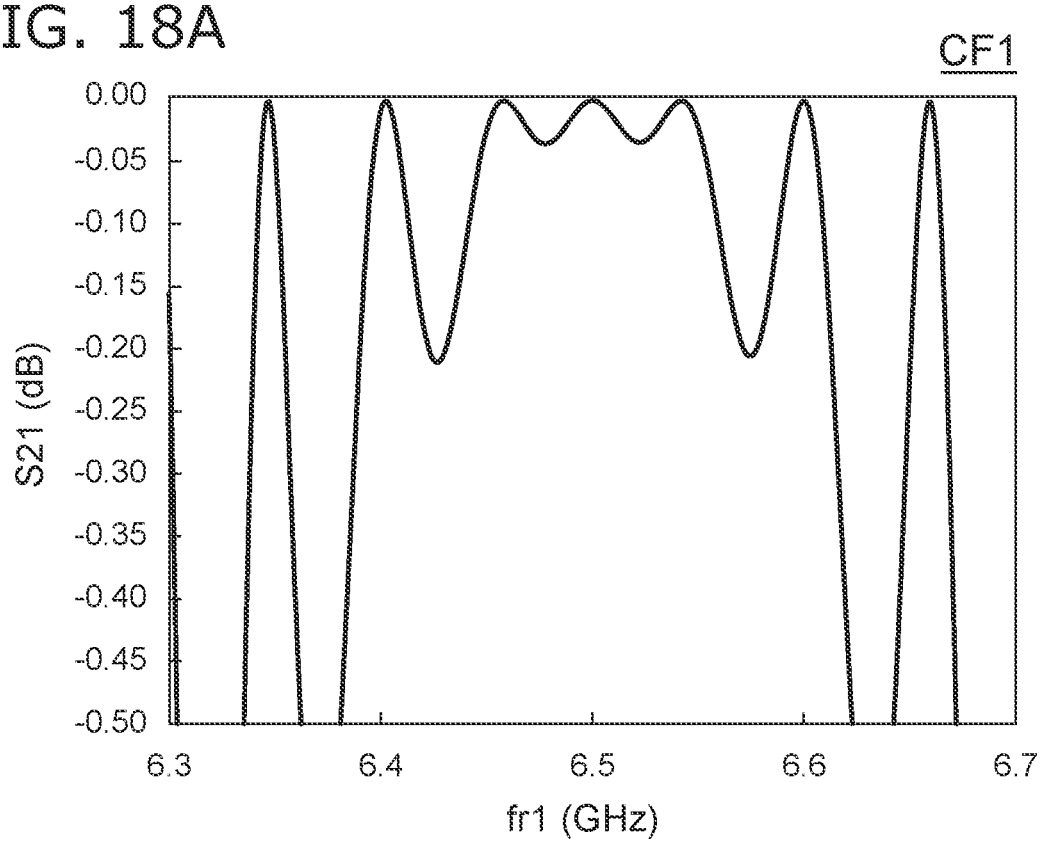
FIGS. 18A and 18B are graphs illustrating characteristics of the electronic circuit.
Figure 18B:
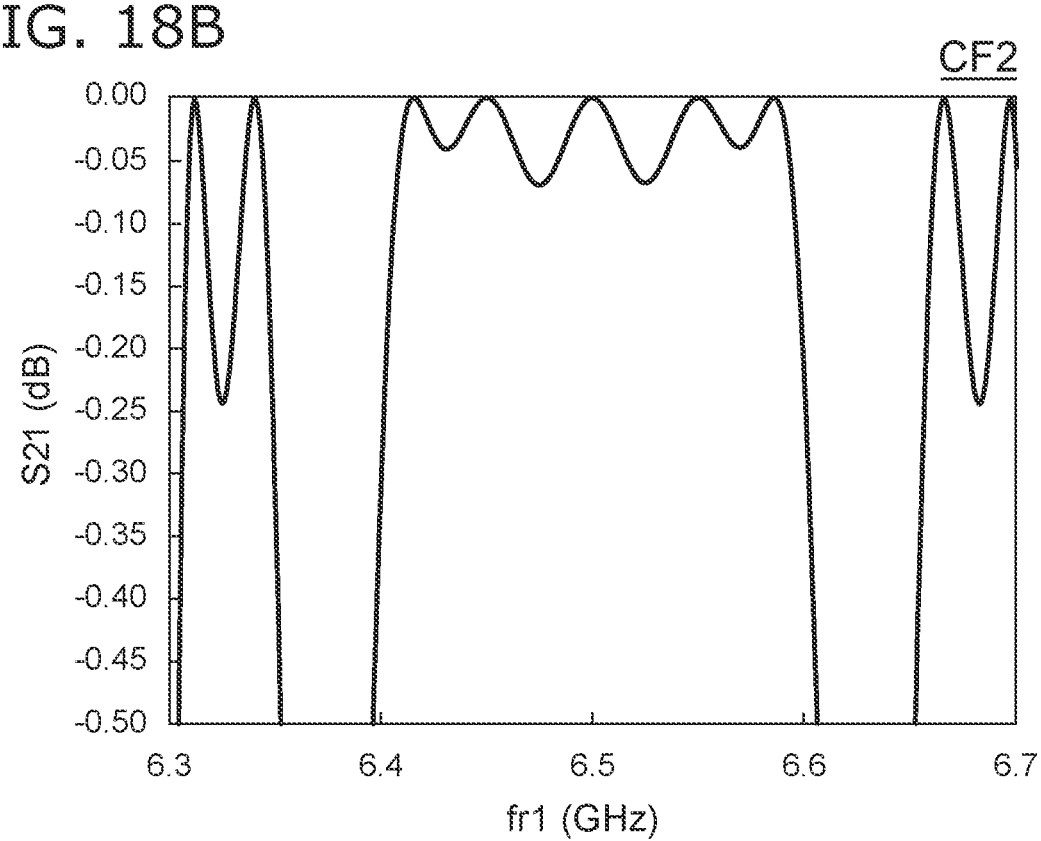

FIGS. 18A and 18B are graphs illustrating characteristics of the electronic circuit.

FIG. 18A shows an enlarged portion of FIG. 16A. FIG. 18B shows an enlarged portion of FIG. 17A.

As shown in FIGS. 16A and 17A, a relatively good transmission characteristic S21 is obtained for the first and second configurations CF1 and CF2. As shown in the enlarged FIG. 18A, the transmission characteristic S21 is substantially 0 within the necessary bandwidth for the first configuration CF1. On the other hand, as shown in the enlarged FIG. 18B, the transmission characteristic S21 of the second configuration CF2 is about 0.15 dB greater than that of the first configuration CF1. In other words, the loss of the second configuration CF2 is less than the loss of the first configuration CF1.

As described above, by setting the nth coupling coefficient k(n) to be less than the first-type coupling coefficient ks1, the frequency width wx in which the transmission characteristic S21 is substantially 0 can be obtained.

Figure 19:
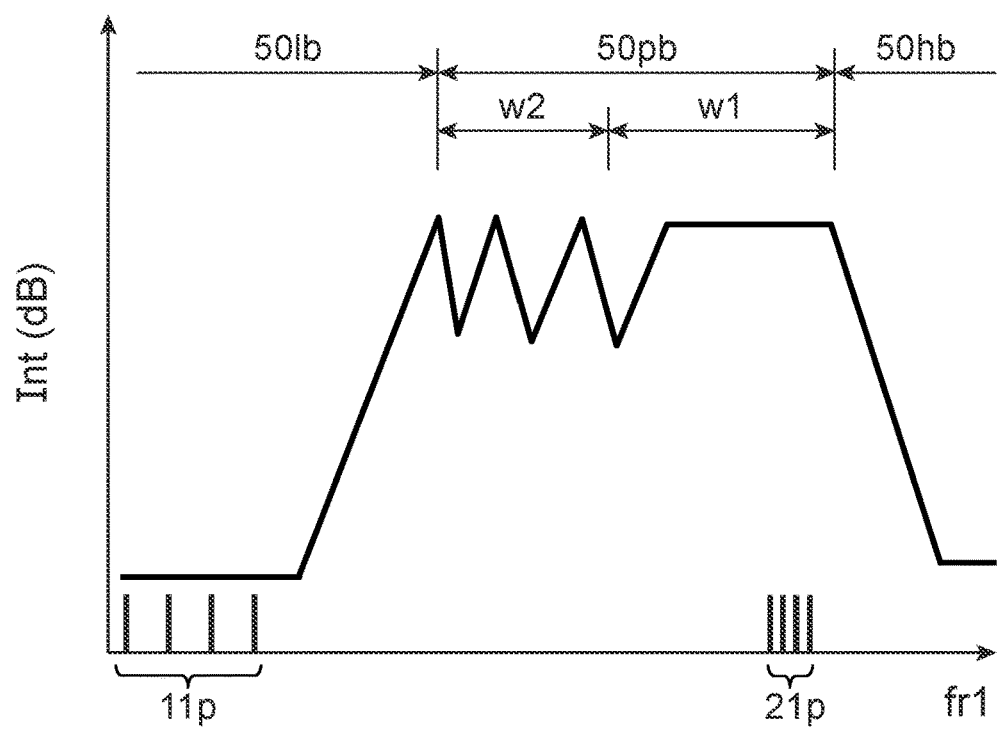
FIG. 19 is a schematic view illustrating an electronic circuit according to the first embodiment.

FIG. 19 is a schematic view illustrating an electronic circuit according to the first embodiment.

In the electronic circuit 112 according to the embodiment as shown in FIG. 19, the passband 50pb of the band-pass filter 50 includes the first passband w1 and the second passband w2.

The third passband w3 may not be included. In the electronic circuit 112, the frequency of the first passband w1 is greater than the frequency of the second passband w2. The out-of-band suppression amount Δ50 can be increased by providing the first passband w1 and the second passband w2 having mutually-different ripple magnitudes. For example, a faster readout operation is possible. For example, the multiple first qubits 11 can be provided at higher density.

Figure 20:
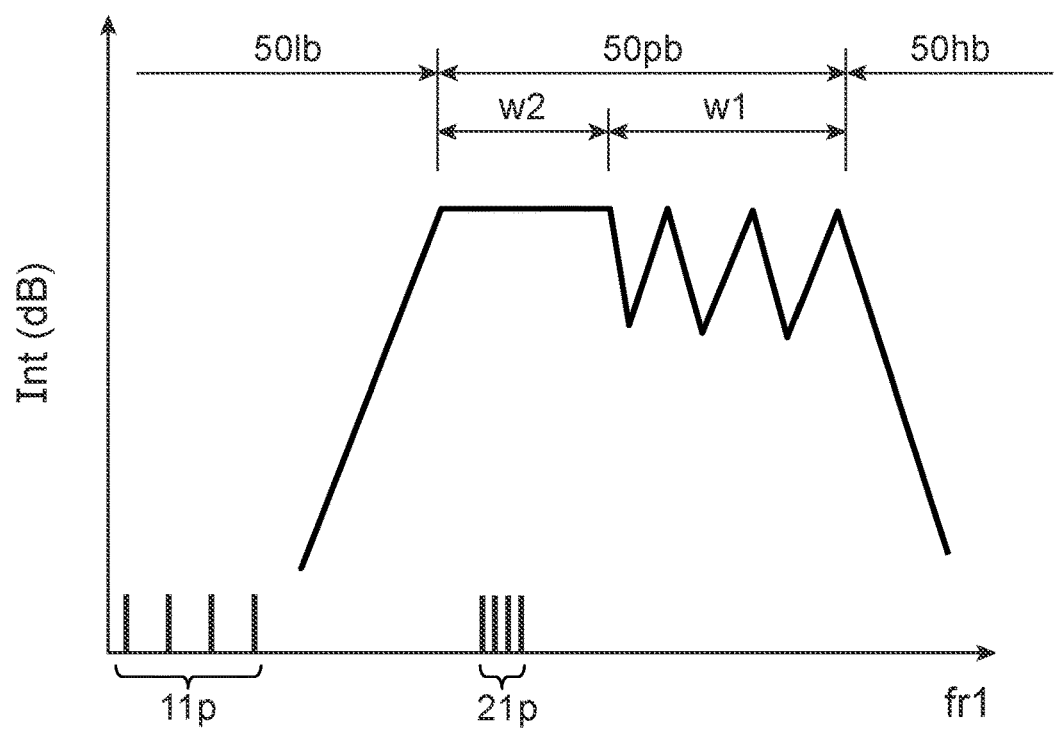
FIG. 20 is a schematic view illustrating an electronic circuit according to the first embodiment.

FIG. 20 is a schematic view illustrating an electronic circuit according to the first embodiment.

In the electronic circuit 113 according to the embodiment as shown in FIG. 20, the passband 50pb of the band-pass filter 50 includes the first passband w1 and the second passband w2. The third passband w3 is not included. In the electronic circuit 113, the frequency of the first passband w1 is greater than the frequency of the second passband w2. The out-of-band suppression amount Δ50 can be increased by providing the first passband w1 and the second passband w2 having mutually-different ripple magnitudes. For example, a faster readout operation is possible. For example, the multiple first qubits 11 can be provided at higher density.

Figure 21:
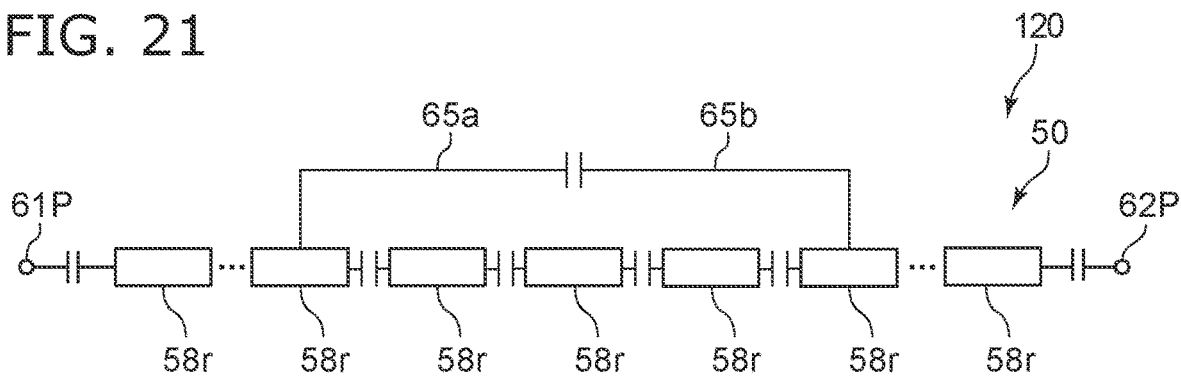
FIG. 21 is a schematic view illustrating an electronic circuit according to the first embodiment.

FIG. 21 is a schematic view illustrating an electronic circuit according to the first embodiment.

In an electronic circuit 120 according to the embodiment as shown in FIG. 21, two non-adjacent filter resonators 58r of the multiple filter resonators 58r are couplable. Otherwise, the configuration of the electronic circuit 120 may be similar to the configurations of the electronic circuits 110 to 113.

In the electronic circuit 120, for example, the two non-adjacent filter resonators 58r are mutually couplable by a conductive member 65a and a conductive member 65b. For example, in the transmission characteristic 50p of the band-pass filter 50, a high steepness is easily obtained by "cross-coupling".

Figure 22:
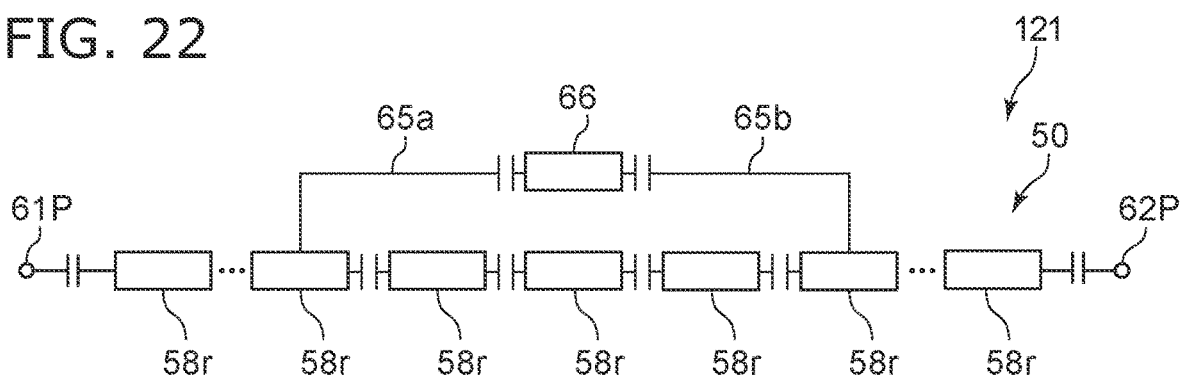
FIG. 22 is a schematic view illustrating an electronic circuit according to the first embodiment.

FIG. 22 is a schematic view illustrating an electronic circuit according to the first embodiment.

In the electronic circuit 121 according to the embodiment as shown in FIG. 22, the band-pass filter 50 further includes a first waveguide 66. An end portion of the first waveguide 66 is couplable with one of two non-adjacent filter resonators 58r of the multiple filter resonators 58r. Another end portion of the first waveguide 66 is couplable with the other of the two non-adjacent filter resonators 58r of the multiple filter resonators 58r. Otherwise, the configuration of the electronic circuit 121 may be similar to the configurations of the electronic circuits 110 to 113 or 120.

For example, the length of the first waveguide 66 is substantially not less than 0.9 times and not more than 1.1 times an odd multiple ((2m+1) times) of ¼ of a wavelength $\lambda$ corresponding to the center frequency of the passband 50pb of the band-pass filter 50. "i" is an integer not less than 0. For example, "cross-coupling" having good and realistic characteristics is obtained.

In the electronic circuits described above, the length of each of the multiple filter resonators 58r may be, for example, substantially $\lambda/2$. The length of each of the multiple filter resonators 58r may be, for example, not less than 0.9 times and not more than 1.1 times $\lambda/2$. For example, each of the multiple filter resonators 58r may be a half-wavelength waveguide resonator. For example, each of the multiple filter resonators 58r may be a ¼-wavelength waveguide resonator.

Figure 23:
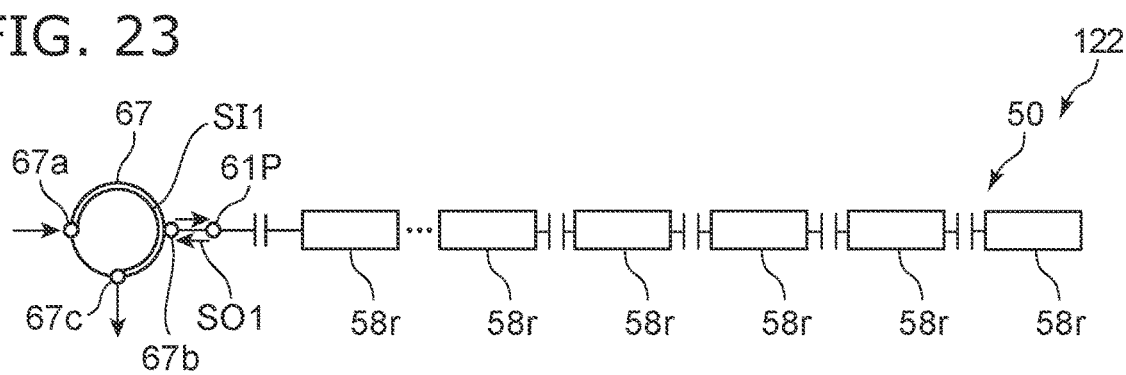
FIG. 23 is a schematic view illustrating an electronic circuit according to the first embodiment.

FIG. 23 is a schematic view illustrating an electronic circuit according to the first embodiment.

As shown in FIG. 23, the electronic circuit 122 according to the embodiment includes a circulator 67. Otherwise, the configuration of the electronic circuit 122 may be similar to the configurations of the electronic circuits 110 to 113, 120, or 121.

The circulator 67 is configured to supply an input signal SI1 to the band-pass filter 50. The circulator 67 is configured to acquire an output signal S01 obtained from the band-pass filter 50. For example, the circulator 67 includes a first port 67a, a second port 67b, and a third port 67c. In the circulator 67, the signal (the input signal SI1) that is input from the first port 67a is output to the second port 67b. The third port 67c is isolated at this time. On the other hand, the signal (the output signal S01) that is input from the second port 67b is output to the third port 67c. The first port 67a is isolated at this time. The signal that is input from the third port 67c is output to the first port 67a. The second port 67b is isolated at this time. The input signal SI1 is caused to pass through the second port 67b by the circulator 67. For example, the output signal S01 that is input from the second port 67b is output to the third port 67c by the circulator 67 but is not output to the first port 67a.

Figure 24:
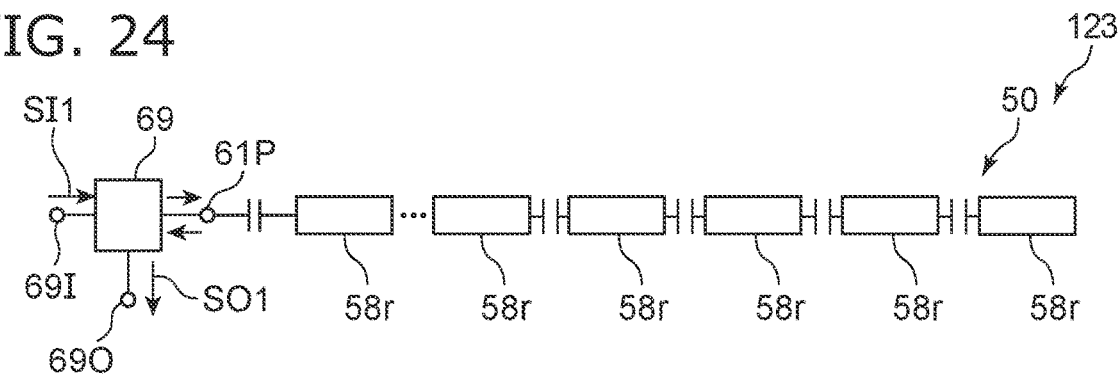
FIG. 24 is a schematic view illustrating an electronic circuit according to the first embodiment.

FIG. 24 is a schematic view illustrating an electronic circuit according to the first embodiment.

As shown in FIG. 24, the electronic circuit 123 according to the embodiment includes a directional coupler 69. Otherwise, the electronic circuit 123 may be similar to the configurations of the electronic circuits 110 to 113, 120, or 121.

The directional coupler 69 includes an input part 691 and an output part 690. The directional coupler 69 is configured to supply the input signal SI1 input to the input part 691 to the band-pass filter 50. The output part 690 is configured to output the output signal S01 obtained from the band-pass filter 50.

Figure 25:
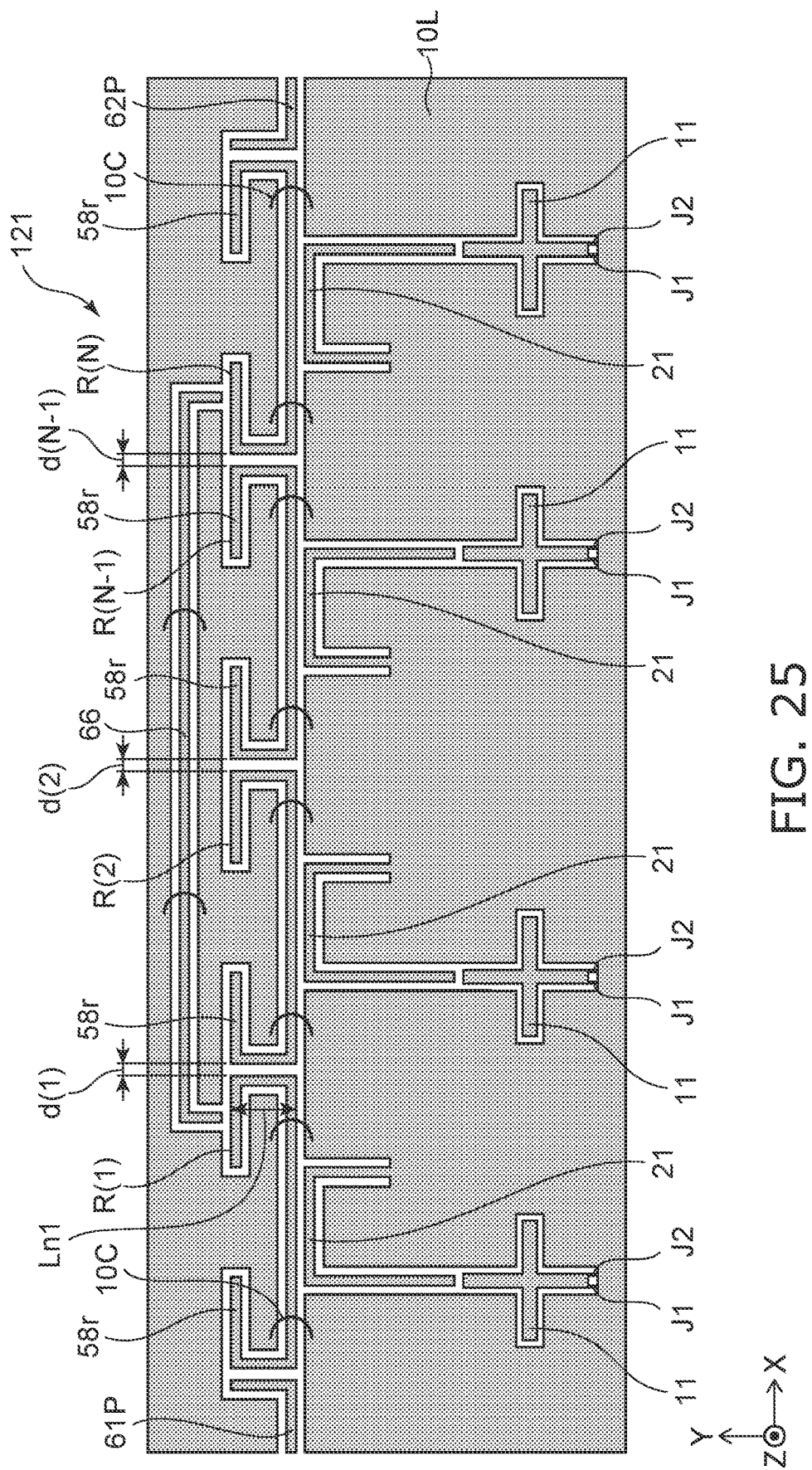
FIG. 25 is a schematic plan view illustrating an electronic circuit according to the first embodiment.

FIG. 25 is a schematic plan view illustrating an electronic circuit according to the first embodiment.

FIG. 25 shows one example of the electronic circuit 121. For example, the multiple filter resonators 58r, the multiple first qubits 11, the multiple first readout resonators 21, etc., can be formed from a conductive layer 10L. In the example, the first waveguide 66 that is formed from the conductive layer 10L also is included. As shown in FIG. 25, multiple Josephson junctions (a first Josephson junction J1, a second Josephson junction J2, etc.) are included in each of the multiple first qubits 11. The current path that includes the multiple Josephson junctions is a closed loop. A dc-SQUID (superconducting quantum interference device) is formed of the current path. For example, the space that is surrounded with the current path including multiple Josephson junctions corresponds to a SQUID loop. For example, the multiple first qubits 11 correspond to transmon resonators.

FIGS. 26A and 26B are schematic cross-sectional views illustrating portions of the electronic circuit according to the first embodiment.

FIG. 26A illustrates the first Josephson junction J1. For example, a first conductive layer 10a and a second conductive layer 10b is located on a first surface 10f of a substrate 10s. A first insulating layer 10i is located between a portion of the first conductive layer 10a and a portion of the second conductive layer 10b. The first Josephson junction J1 is formed from the first insulating layer 10i and these conductive layers.

FIG. 26B illustrates the second Josephson junction J2. For example, a third conductive layer 10c and a fourth conductive layer 10d are located on the first surface 10f of the substrate 10s. A second insulating layer 10j is located between a portion of the third conductive layer 10c and a portion of the fourth conductive layer 10d. The second Josephson junction J2 is formed from the second insulating layer 10j and these conductive layers.

The third conductive layer 10c may be connected with or continuous with one of the first conductive layer 10a or the second conductive layer 10b. The fourth conductive layer 10d may be connected with or continuous with the other of the first conductive layer 10a or the second conductive layer 10b. The second insulating layer 10j may be continuous with the first insulating layer 10i.

The direction from a portion of the first conductive layer 10a toward a portion of the second conductive layer 10b is taken as a Z-axis direction. One direction perpendicular to the Z-axis direction is taken as an X-axis direction. A direction perpendicular to the Z-axis direction and the X-axis direction is taken as a Y-axis direction. The first conductive layer 10a, the second conductive layer 10b, the third conductive layer 10c, and the fourth conductive layer 10d correspond to portions of the conductive layer 10L. The conductive layer 10L is along the X-Y plane (see FIG. 25).

The appropriate coupling coefficient k is obtained by appropriately controlling the first distance d(1), the second distance d(2), . . . , and the (N−1)th distance d(N−1) shown in FIG. 25. The coupling coefficient k is high when these distances are short.

A length Ln1 along which the multiple filter resonators 58r shown in FIG. 25 face each other is appropriately determined. The coupling coefficient k increases as the length Ln1 increases.

In the electronic circuit 121, a transmon qubit that includes multiple Josephson junctions is applied to each of the multiple first qubits 11. According to the embodiment, a transmon qubit that includes one Josephson junction is applicable to the at least one of the multiple first qubits 11.

According to the embodiment, a base conductive member 10M may be located at a second surface 10g of the substrate 10s. The first surface 10f is between the second surface 10g and the conductive layer 10L. The second surface 10g is between the base conductive member 10M and the first surface 10f. The second surface 10g is the surface at the side opposite to the first surface 10f. For example, the base conductive member 10M may be set to a fixed potential. The base conductive member 10M may be, for example, a ground plane. The second surface 10g may contact a conductive housing. The base conductive member 10M may be at least a portion of a conductive housing. The base conductive member 10M and a portion of the conductive layer 10L may be electrically connected by a connection member. The connection member may be a via extending through the substrate 10s.

Several of the multiple conductive layers 10L are located around the resonators, the signal lines, etc. Several of the multiple conductive layers 10L are used as ground layers. The multiple conductive layers 10L that correspond to ground layers may be electrically connected to each other by a connection conductive member 10C. The connection conductive member 10C may include, for example, wires, etc. The connection conductive member 10C may include at least a portion of the base conductive member 10M. The connection conductive member 10C may include a conductive via (a connection member) extending through the substrate 10s.

Second Embodiment

A second embodiment relates to a calculator.

FIG. 27 is a schematic view illustrating the calculator according to the second embodiment.

As shown in FIG. 27, the calculator 210 according to the embodiment includes the electronic circuit according to the first embodiment (in the example, the electronic circuit 110) and a controller 70. The controller 70 is configured to control the state of the first qubit. For example, a control conductive member 60 is located in the electronic circuit or the calculator. The control conductive member 60 may be located at the vicinity of the first qubit 11. The controller 70 supplies an alternating current to the control conductive member 60. The magnetic field that is generated from the control conductive member 60 is applied to the first qubit 11. The controller 70 is configured to control the state of the first qubit by controlling the alternating current. A calculation operation is possible in the calculator 210.

According to embodiments, for example, an electronic circuit can be provided in which faster readout of the qubit information is possible. According to embodiments, for example, a calculator can be provided in which complex calculations are possible. According to embodiments, for example, a calculator can be provided in which faster calculations are possible.

Embodiments may include the following configurations (e.g., technological proposals).

Configuration 1

An electronic circuit, comprising:
a band-pass filter including a plurality of filter resonators, two adjacent filter resonators included in the plurality of filter resonators being mutually couplable; and
at least one first circuit, the first circuit including a first qubit and a first readout resonator, the first readout resonator being couplable with the first qubit and one of the plurality of filter resonators,
a passband of the band-pass filter including a first passband and a second passband,
a magnitude of a first ripple of the first passband being not more than $\frac{1}{10}$ of a magnitude of a second ripple of the second passband.

Configuration 2

The electronic circuit according to Configuration 1, wherein
the passband further includes a third passband,
the first passband is between the second passband and the third passband, and
the magnitude of the first ripple is not more than $\frac{1}{10}$ of a magnitude of a third ripple of the third passband.

Configuration 3

The electronic circuit according to Configuration 1 or 2, wherein
a resonant frequency of the first readout resonator is included in the first passband.

Configuration 4

The electronic circuit according to Configuration 3, wherein
a frequency of the first passband is greater than a frequency of the second passband.

Configuration 5

The electronic circuit according to Configuration 3, wherein
a frequency of the first passband is less than a frequency of the second passband.

Configuration 6

The electronic circuit according to any one of Configurations 1 to 5, wherein
a resonant frequency of the first qubit is included in a non-pass band of the band-pass filter.

Configuration 7

An electronic circuit, comprising:
a band-pass filter including a plurality of filter resonators, two adjacent filter resonators included in the plurality of filter resonators being mutually couplable; and
at least one first circuit, the first circuit including a first qubit and a first readout resonator, the first readout resonator being couplable with the first qubit and one of the plurality of filter resonators,
a number of the plurality of filter resonators being an even number not less than 4,
the band-pass filter including a plurality of coupling coefficients,
one of the plurality of coupling coefficients being a coupling coefficient between the two adjacent filter resonators included in the plurality of filter resonators,
a difference between a minimum value of the plurality of coupling coefficients and a maximum value of the plurality of coupling coefficients being not more than 0.1 times an average value of the plurality of coupling coefficients.

Configuration 8

The electronic circuit according to Configuration 7, wherein
the band-pass filter further includes a first part configured to receive input of a signal,
the first part is couplable with one of the plurality of filter resonators,
an external Q between the first part and the one of the plurality of filter resonators couplable with the first part is a first part external Qe, the one of the plurality of coupling coefficients is not less than a first value and not more than a second value,
the first value is $(2\times10^{-7})\times Qe^4-(2\times10^{-5})\times Qe^3+0.0009\times Qe^2-0.0211\times Qe+0.2361$, and
the second value is $0.0003\times Qe^2-0.014\times Qe+0.2216$.

Configuration 9

The electronic circuit according to Configuration 8, wherein
the band-pass filter further includes a second part configured to output the signal,
the second part is couplable with another one of the plurality of filter resonators,
an external Q between the second part and the other one of the plurality of filter resonators couplable with the second part is a second part external Qf,
the one of the plurality of coupling coefficients is not less than a third value and not more than a fourth value,
the third value is $(2\times10^{-7})\times Qf^4-(2\times10^{-5})\times Qf^3+0.0009\times Qf^2-0.0211\times Qf+0.2361$, and
the fourth value is $0.0003\times Qf^2-0.014\times Qf+0.2216$.

Configuration 10

The electronic circuit according to any one of Configurations 7 to 9, wherein
the band-pass filter includes a plurality of distances, one of the plurality of distances is a distance between the two adjacent filter resonators included in the plurality of filter resonators, and
a difference between a minimum value of the plurality of distances and a maximum value of the plurality of distances is not more than 0.1 times an average value of the plurality of distances.

Configuration 11

An electronic circuit, comprising:
a band-pass filter including a plurality of filter resonators, two adjacent filter resonators included in the plurality of filter resonators being mutually couplable; and
at least one first circuit, the first circuit including a first qubit and a first readout resonator, the first readout resonator being couplable with the first qubit and one of the plurality of filter resonators,
the plurality of filter resonators including first to Nth filter resonators, N being (2n+1), n being an integer not less than 2,
the plurality of filter resonators including an (n−1)th resonator, an nth resonator, an (n+1)th resonator, an (n+2)th resonator, and an (n+3)th resonator,
a coupling coefficient between the (n−1)th resonator and the nth resonator being an (n−1)th coupling coefficient,
a coupling coefficient between the nth resonator and the (n+1)th resonator being an nth coupling coefficient,
a coupling coefficient between the (n+1)th resonator and the (n+2)th resonator being an (n+1)th coupling coefficient,
a coupling coefficient between the (n+2)th resonator and the (n+3)th resonator being an (n+2)th coupling coefficient,
the nth coupling coefficient being not less than 0.7 times but less than 0.9 times the (n−1)th coupling coefficient and not less than 0.7 times but less than 0.9 times the (n+2)th coupling coefficient,
the (n+1)th coupling coefficient being not less than 0.7 times but less than 0.9 times the (n−1)th coupling coefficient and not less than 0.7 times but less than 0.9 times the (n+2)th coupling coefficient.

Configuration 12

The electronic circuit according to Configuration 11, wherein
n is not less than 3,
the band-pass filter includes a plurality of first-type coupling coefficients and a plurality of second-type coupling coefficients,
one of the plurality of first-type coupling coefficients is a coupling coefficient of two adjacent filter resonators included in the first to nth filter resonators,
a difference between a minimum value of the plurality of first-type coupling coefficients and a maximum value of the plurality of first-type coupling coefficients is not more than 0.1 times an average value of the plurality of first-type coupling coefficients,
one of the plurality of second-type coupling coefficients is a coupling coefficient of two adjacent filter resonators included in the (n+2)th to (2n+1)th filter resonators, and
a difference between a minimum value of the plurality of second-type coupling coefficients and a maximum value of the plurality of second-type coupling coefficients is not more than 0.1 times an average value of the plurality of second-type coupling coefficients.

Configuration 13

The electronic circuit according to Configuration 12, wherein
the band-pass filter further includes a first part configured to receive input of a signal,
the first part is couplable with one of the plurality of filter resonators,
an external Q between the first part and the one of the plurality of filter resonators couplable with the first part is a first part external Qe,
the plurality of first-type coupling coefficients and the plurality of second-type coupling coefficients are not less than a first value and not more than a second value,
the first value is $(2\times10^{-7})\times Qe^4-(2\times10^{-5})\times Qe^3+0.0009\times Qe^2-0.0211\times Qe+0.2361$, and the second value is $0.0003\times Qe^2-0.014\times Qe+0.2216$.

Configuration 14

The electronic circuit according to Configuration 13, wherein
the band-pass filter further includes a second part configured to output the signal,
the second part is couplable with another one of the plurality of filter resonators,
an external Q between the second part and the other one of the plurality of filter resonators couplable with the second part is a second part external Qf,
the plurality of first-type coupling coefficients and the plurality of second-type coupling coefficients are not less than a third value and not more than a fourth value,
the third value is $(2\times10^{-7})\times Qf^4-(2\times10^{-5})\times Qf^3+0.0009\times Qf^2-0.0211\times Qf+0.2361$, and the fourth value is $0.0003\times Qf-0.014\times Qf+0.2216$.

Configuration 15

The electronic circuit according to any one of Configurations 11 to 14, wherein
the band-pass filter includes a plurality of first-type distances and a plurality of second-type distances,
one of the plurality of first-type distances is a distance between two adjacent filter resonators included in the first to nth filter resonators,
a difference between a minimum value of the plurality of first-type distances and a maximum value of the plurality of first-type distances is not more than 0.1 times an average value of the plurality of first-type distances,
one of the plurality of second-type distances is a distance between two adjacent filter resonators included in the (n+2)th to (2n+1)th filter resonators, and a difference between a minimum value of the plurality of second-type distances and a maximum value of the plurality of second-type distances is not more than 0.1 times an average value of the plurality of second-type distances.

Configuration 16

The electronic circuit according to any one of Configurations 1 to 15, wherein
two non-adjacent filter resonators of the plurality of filter resonators are mutually couplable.

Configuration 17

The electronic circuit according to any one of Configurations 1 to 15, wherein
the band-pass filter further includes a first waveguide, an end portion of the first waveguide is couplable with one of two non-adjacent filter resonators of the plurality of filter resonators, and
another end portion of the first waveguide is couplable with the other of the two non-adjacent filter resonators of the plurality of filter resonators.

Configuration 18

The electronic circuit according to any one of Configurations 1 to 17, further comprising:
a circulator,
the circulator being configured to supply an input signal to the band-pass filter,
the circulator being configured to acquire an output signal obtained from the band-pass filter.

Configuration 19

The electronic circuit according to any one of Configurations 1 to 17, further comprising:
a directional coupler including an input part and an output part,
the directional coupler being configured to supply an input signal to the band-pass filter,
the input signal being input to the input part,
the output part being configured to output an output signal obtained from the band-pass filter.

Configuration 20

A calculator, comprising:
the electronic circuit according to any one of Configurations 1 to 19; and
a controller configured to control a state of the first qubit.

According to embodiments, an electronic circuit and a calculator can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic circuits and calculators such as band-pass filters, filter resonators, circuits, qubits, resonators, waveguides, and controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic circuits, and calculators practicable by an appropriate design modification by one skilled in the art based on the electronic circuits, and the calculators described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic circuit, comprising:
a band-pass filter including a plurality of filter resonators, two adjacent filter resonators included in the plurality of filter resonators being mutually couplable; and
at least one first circuit, the first circuit including a first qubit and a first readout resonator, the first readout resonator being couplable with the first qubit and one of the plurality of filter resonators,
a passband of the band-pass filter including a first passband and a second passband,
a magnitude of a first ripple of the first passband being not more than $1/10$ of a magnitude of a second ripple of the second passband.

2. The circuit according to claim 1, wherein
the passband further includes a third passband,
the first passband is between the second passband and the third passband, and
the magnitude of the first ripple is not more than $1/10$ of a magnitude of a third ripple of the third passband.

3. The circuit according to claim 1, wherein
a resonant frequency of the first readout resonator is included in the first passband.

4. The circuit according to claim 3, wherein
a frequency of the first passband is greater than a frequency of the second passband.

5. The circuit according to claim 3, wherein
a frequency of the first passband is less than a frequency of the second passband.

6. The circuit according to claim 3, wherein
a resonant frequency of the first qubit is included in a non-pass band of the band-pass filter.

7. The circuit according to claim 1, wherein
two non-adjacent filter resonators of the plurality of filter resonators are mutually couplable.

8. The circuit according to claim 1, wherein
the band-pass filter further includes a first waveguide, an end portion of the first waveguide is couplable with one of two non-adjacent filter resonators of the plurality of filter resonators, and another end portion of the first waveguide is couplable with the other of the two non-adjacent filter resonators of the plurality of filter resonators.

9. The circuit according to claim 1, further comprising:

a circulator, the circulator being configured to supply an input signal to the band-pass filter, the circulator being configured to acquire an output signal obtained from the band-pass filter.

10. The circuit according to claim 1, further comprising:

a directional coupler including an input part and an output part, the directional coupler being configured to supply an input signal to the band-pass filter, the input signal being input to the input part, the output part being configured to output an output signal obtained from the band-pass filter.

11. A calculator, comprising:

the electronic circuit according to claim 1; and a controller configured to control a state of the first qubit.

* * * * *